US012755806B2

(12) United States Patent
Lu et al.

(10) Patent No.: US 12,755,806 B2
(45) Date of Patent: Oct. 6, 2026

(54) LOGGING A MEMORY ADDRESS ASSOCIATED WITH FAULTY USAGE-BASED DISTURBANCE DATA

(71) Applicant: Micron Technology, Inc., Boise, ID (US)

(72) Inventors: Yang Lu, Boise, ID (US); Mark Kalei Hadrick, Boise, ID (US); Kang-Yong Kim, Boise, ID (US); Donald Morgan, Meridian, ID (US); Victor Wong, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/790,365

(22) Filed: Jul. 31, 2024

(65) Prior Publication Data

US 2025/0131973 A1 Apr. 24, 2025

Related U.S. Application Data

(60) Provisional application No. 63/592,761, filed on Oct. 24, 2023.

(51) Int. Cl.
*G11C 29/44* (2006.01)
*G06F 11/07* (2006.01)
(Continued)

(52) U.S. Cl.
CPC ............ *G11C 29/44* (2013.01); *G06F 11/073* (2013.01); *G06F 11/0772* (2013.01); *G11C 29/30* (2013.01); *G11C 29/36* (2013.01)

(58) Field of Classification Search
CPC ......... G11C 29/44; G11C 29/30; G11C 29/36; G06F 11/073; G06F 11/0772
(Continued)

(56) References Cited

U.S. PATENT DOCUMENTS 6,467,048 B1 10/2002 Olarig et al.
6,539,506 B1 3/2003 Lammers et al.
(Continued)

OTHER PUBLICATIONS

"Non-Final Office Action", U.S. Appl. No. 18/790,795, filed Nov. 12, 2025, 19 pages.
(Continued)

*Primary Examiner* — Amir Zarabian
*Assistant Examiner* — Daniel John King
(74) *Attorney, Agent, or Firm* — Colby Nipper PLLC

(57) ABSTRACT

Apparatuses and techniques for logging a memory address associated with faulty usage-based disturbance data are described. In an example aspect, a memory device can detect, at a local-bank level, a fault associated with usage-based disturbance data. This detection enables the memory device to log a row address associated with the faulty usage-based disturbance data. To avoid increasing a complexity and/or a size of the memory device, some implementations of the memory device can perform the address logging at the multi-bank level with the assistance of an engine, such as a test engine. The memory device stores the logged address in at least one mode register to communicate the fault to a memory controller. With the logged address, the memory controller can initiate a repair procedure to fix the faulty usage-based disturbance data.

20 Claims, 12 Drawing Sheets

(51) Int. Cl.
*G11C 29/30* (2006.01)
*G11C 29/36* (2006.01)

(58) Field of Classification Search
USPC .................................................... 365/185.09
See application file for complete search history.

(56) References Cited

U.S. PATENT DOCUMENTS 9,104,646 B2 8/2015 Zheng et al.
10,262,717 B2 4/2019 Fisch et al.
2012/0254524 A1* 10/2012 Fujimoto ............ G06F 12/0246 711/E12.008
2019/0019569 A1 1/2019 Pope
2019/0066808 A1 2/2019 Nale
2019/0369884 A1* 12/2019 Miura ................... G06F 3/0659
2021/0026733 A1* 1/2021 Lee ........................ G06F 11/073
2021/0397510 A1 12/2021 Liu et al.
2022/0122684 A1* 4/2022 Pecha ................ G11C 29/4401
2022/0139482 A1* 5/2022 Kim .................... G06F 11/1068 714/719
2022/0382464 A1 12/2022 Kim et al.
2023/0185664 A1 6/2023 Chung et al.
2025/0130877 A1 4/2025 Lu et al.
2026/0037355 A1 2/2026 Wong et al.

OTHER PUBLICATIONS

"Final Office Action", U.S. Appl. No. 18/790,795, filed May 11, 2026, 13 pages.

* cited by examiner

LOGGING A MEMORY ADDRESS ASSOCIATED WITH FAULTY USAGE-BASED DISTURBANCE DATA

CROSS-REFERENCE TO RELATED APPLICATION(S)

This application claims the benefit of U.S. Provisional Patent Application Ser. No. 63/592,761, filed on Oct. 24, 2023, the disclosure of which is incorporated by reference herein in its entirety.

BACKGROUND

Computers, smartphones, and other electronic devices rely on processors and memories. A processor executes code based on data to run applications and provide features to a user. The processor obtains the code and the data from a memory. The memory in an electronic device can include volatile memory (e.g., random-access memory (RAM)) and non-volatile memory (e.g., flash memory). Like the capabilities of a processor, the capabilities of a memory can impact the performance of an electronic device. This performance impact can increase as processors are developed that execute code faster and as applications operate on increasingly larger data sets that require ever-larger memories.

BRIEF DESCRIPTION OF THE DRAWINGS

Apparatuses of and techniques for logging a memory address associated with faulty usage-based disturbance data are described with reference to the following drawings. The same numbers are used throughout the drawings to reference like features and components.

DETAILED DESCRIPTION

Overview

Figure 1:
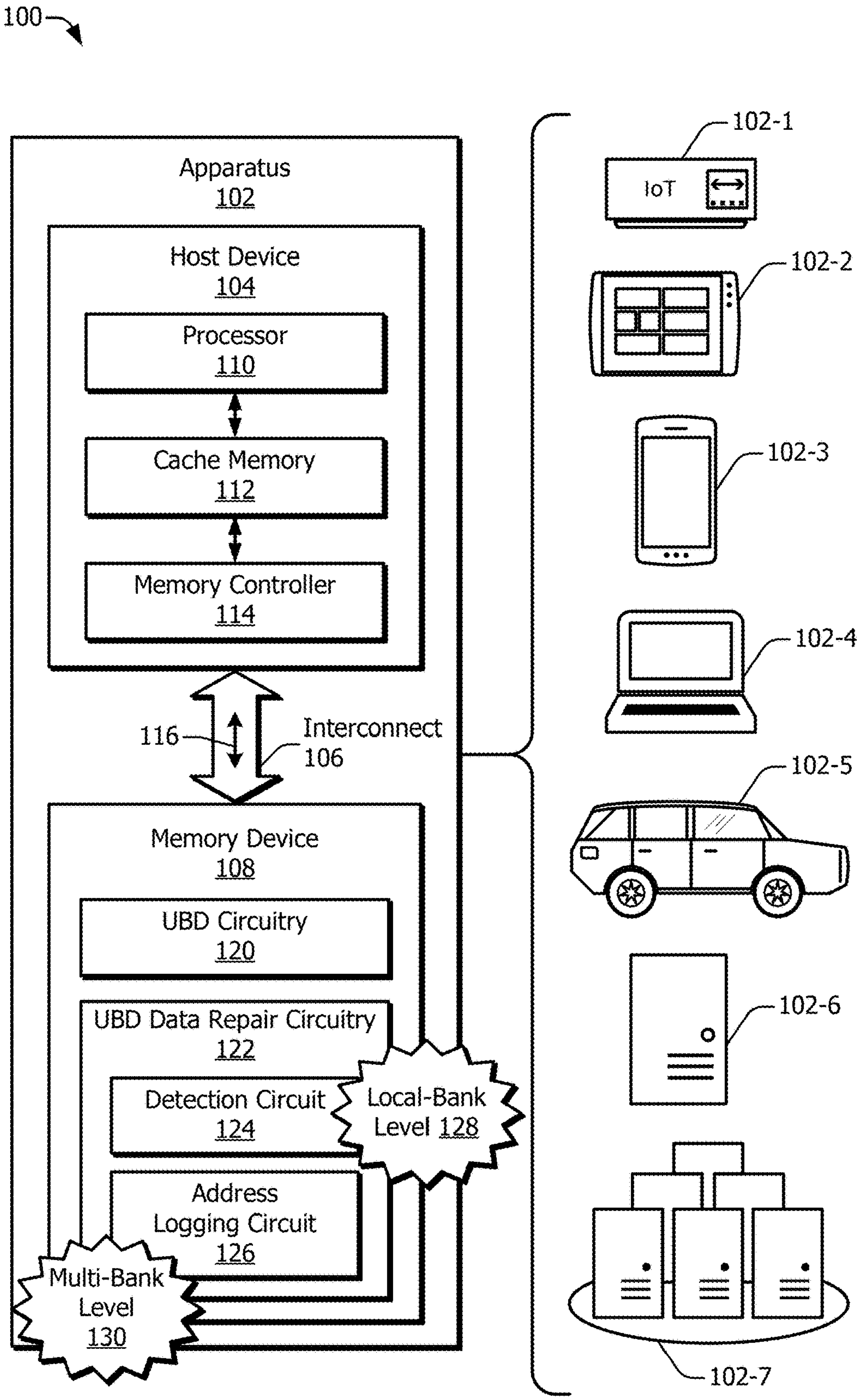
FIG. 1 illustrates example apparatuses that can implement aspects of logging a memory address associated with faulty usage-based disturbance data.

Processors and memory work in tandem to provide features to users of computers and other electronic devices. As processors and memory operate more quickly together in a complementary manner, an electronic device can provide enhanced features, such as high-resolution graphics and artificial intelligence (AI) analysis. Some applications, such as those for financial services, medical devices, and advanced driver assistance systems (ADAS), can also demand more-reliable memories. These applications use increasingly reliable memories to limit errors in financial transactions, medical decisions, and object identification. However, in some implementations, more-reliable memories can sacrifice bit densities, power efficiency, and simplicity.

To meet the demands for physically smaller memories, memory devices can be designed with higher chip densities. Increasing chip density, however, can increase the electromagnetic coupling (e.g., capacitive coupling) between adjacent or proximate rows of memory cells due, at least in part, to a shrinking distance between these rows. With this undesired coupling, activation (or charging) of a first row of memory cells can sometimes negatively impact a second nearby row of memory cells. In particular, activation of the first row can generate interference, or crosstalk, that causes the second row to experience a voltage fluctuation. In some instances, this voltage fluctuation can cause a state (or value) of a memory cell in the second row to be incorrectly determined by a sense amplifier. Consider an example in which a state of a memory cell in the second row is a "1." In this example, the voltage fluctuation can cause a sense amplifier to incorrectly determine the state of the memory cell to be a "0" instead of a "1." Left unchecked, this interference can lead to memory errors or data loss within the memory device.

In some circumstances, a particular row of memory cells is activated repeatedly in an unintentional or intentional (sometimes malicious) manner. Consider, for instance, that memory cells in an $R^{th}$ row are subjected to repeated activation, which causes one or more memory cells in a proximate row (e.g., within an R+1 row, an R+2 row, an R−1 row, and/or an R−2 row) to change states. This effect is referred to as usage-based disturbance. The occurrence of usage-based disturbance can lead to the corruption or changing of contents within the affected row of memory.

Some memory devices utilize circuits that can detect usage-based disturbance and mitigate its effects. To monitor for usage-based disturbance, a memory device can store an activation count within each row of a memory array. The activation count keeps track of a quantity of accesses or activations of the corresponding memory row. If the activation count meets or exceeds a threshold, proximate rows, including one or more adjacent rows, may be at increased risk for data corruption due to the repeated activations of the accessed row and the usage-based disturbance effect. To manage this risk to the affected rows, the memory device can refresh the proximate rows.

The effectiveness of this protective feature is jeopardized, however, if an activation count malfunctions or is otherwise faulty. The activation count, for instance, can become corrupted when read or written during the array counter update procedure. In another aspect, the memory cells that store the activation count can fail to retain the stored value of the activation count.

The memory device can perform a repair process that replaces a faulty activation count in a permanent (or "hard") manner or in a temporary (or "soft") manner. The repair process, however, is initiated by a host device (or a memory controller). In some implementations, the host device may not have the means to directly detect the faulty activation count. Without the ability to write to or read from the memory cells that store the activation count, for instance, the host device may be unable to assess whether or not the activation count is faulty. Consequently, the host device may be unable to initiate the repair process when an activation count becomes faulty.

To address this and other issues regarding usage-based disturbance, this document describes techniques for logging a memory address associated with faulty usage-based disturbance data. In an example aspect, a memory device stores usage-based disturbance data within a subset of memory cells of multiple rows of a memory array. The memory device can detect, at a local-bank level, a fault associated with the usage-based disturbance data. This detection enables the memory device to log an address associated with the faulty usage-based disturbance data. To avoid increasing a complexity and/or a size of the memory device, some implementations of the memory device can perform the address logging at the multi-bank level with the assistance of an engine, such as a test engine. The memory device stores the logged address in at least one mode register to communicate the fault to a memory controller. With the logged address, the memory controller can initiate a repair procedure to fix the faulty usage-based disturbance data.

Example Operating Environments

FIG. 1 illustrates, at 100 generally, an example operating environment including an apparatus 102 that can implement aspects of logging a memory address associated with faulty usage-based disturbance data. The apparatus 102 can include various types of electronic devices, including an internet-of-things (IoT) device 102-1, tablet device 102-2, smartphone 102-3, notebook computer 102-4, passenger vehicle 102-5, server computer 102-6, and server cluster 102-7 that may be part of cloud computing infrastructure, a data center, or a portion thereof (e.g., a printed circuit board (PCB)). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, vehicle, drone, industrial equipment, security device, sensor, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and a memory controller 114. The memory device 108, which can also be realized with a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device (e.g., a flash memory, hard disk drive, solid-state drive, phase-change memory (PCM), or memory employing 3D XPoint™).

The processor 110 is operatively coupled to the cache memory 112, which is operatively coupled to the memory controller 114. The processor 110 is also coupled, directly or indirectly, to the memory controller 114. The host device 104 may include other components to form, for instance, a system-on-a-chip (SoC). The processor 110 may include a general-purpose processor, central processing unit, graphics processing unit (GPU), neural network engine or accelerator, application-specific integrated circuit (ASIC), field-programmable gate array (FPGA) integrated circuit (IC), or communications processor (e.g., a modem or baseband processor).

In operation, the memory controller 114 can provide a high-level or logical interface between the processor 110 and at least one memory (e.g., an external memory). The memory controller 114 may be realized with any of a variety of suitable memory controllers (e.g., a double-data-rate (DDR) memory controller that can process requests for data stored on the memory device 108). Although not shown, the host device 104 may include a physical interface (PHY) that transfers data between the memory controller 114 and the memory device 108 through the interconnect 106. For example, the physical interface may be an interface that is compatible with a DDR PHY Interface (DFI) Group interface protocol. The memory controller 114 can, for example, receive memory requests from the processor 110 and provide the memory requests to external memory with appropriate formatting, timing, and reordering. The memory controller 114 can also forward to the processor 110 responses to the memory requests received from external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus (e.g., a unidirectional or bidirectional bus), switching fabric, or one or more wires that carry voltage or current signals. The interconnect 106 can propagate one or more communications 116 between the host device 104 and the memory device 108. For example, the host device 104 may transmit a memory request to the memory device 108 over the interconnect 106. Also, the memory device 108 may transmit a corresponding memory response to the host device 104 over the interconnect 106.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the memory controller 114. A memory (e.g., the memory device 108) may have an "internal" or "local" cache memory. As another example, the apparatus 102 may include cache memory between the interconnect 106 and the memory device 108. Computer engineers can also include any of the illustrated components in distributed or shared memory systems.

Computer engineers may implement the host device 104 and the various memories in multiple manners. In some cases, the host device 104 and the memory device 108 can be disposed on, or physically supported by, a printed circuit board (e.g., a rigid or flexible motherboard). The host device 104 and the memory device 108 may additionally be integrated together on an integrated circuit or fabricated on separate integrated circuits and packaged together. The memory device 108 may also be coupled to multiple host devices 104 via one or more interconnects 106 and may respond to memory requests from two or more host devices 104. Each host device 104 may include a respective memory controller 114, or the multiple host devices 104 may share a memory controller 114. This document describes with reference to FIG. 1 an example computing system architecture having at least one host device 104 coupled to a memory device 108.

Two or more memory components (e.g., modules, dies, banks, or bank groups) can share the electrical paths or couplings of the interconnect 106. The interconnect 106 can include at least one command-and-address bus (CA bus) and at least one data bus (DQ bus). The command-and-address bus can transmit addresses and commands from the memory controller 114 of the host device 104 to the memory device 108, which may exclude propagation of data. The data bus can propagate data between the memory controller 114 and the memory device 108. The memory device 108 may also be implemented as any suitable memory including, but not limited to, DRAM, SDRAM, three-dimensional (3D) stacked DRAM, DDR memory, or LPDDR memory (e.g., LPDDR DRAM or LPDDR SDRAM).

The memory device 108 can form at least part of the main memory of the apparatus 102. The memory device 108 may, however, form at least part of a cache memory, a storage memory, or a system-on-chip of the apparatus 102. The memory device 108 includes at least one instance of usage-based disturbance circuitry 120 (UBD circuitry 120) and at least one instance of usage-based disturbance data repair circuitry 122 (UBD data repair circuitry 122).

The usage-based disturbance circuitry 120 mitigates usage-based disturbance for one or more banks associated with the memory device 108. The usage-based disturbance circuitry 120 can be implemented using software, firmware, hardware, fixed circuit circuitry, or combinations thereof. The usage-based disturbance circuitry 120 can also include at least one counter circuit for detecting conditions associated with usage-based disturbance, at least one queue for managing refresh operations for mitigating the usage-based disturbance, and/or at least one error-correction-code (ECC) circuit for detecting and/or correcting bit errors associated with usage-based disturbance.

One aspect of usage-based disturbance mitigation involves keeping track of how often a row is activated or accessed since a last refresh. In particular, the usage-based disturbance circuitry 120 performs an array counter update procedure using the counter circuit to update an activation count associated with an activated row. During the array counter update procedure, the usage-based disturbance circuitry 120 reads the activation count that is stored within the activated row, increments the activation count, and writes the updated activation count to the activated row. By maintaining the activation count, the usage-based disturbance circuitry 120 can determine when to perform a refresh operation to reduce the risk of usage-based disturbance. For example, when the activation count meets or exceeds a threshold, the usage-based disturbance circuitry 120 can perform a mitigation procedure that refreshes one or more rows that are near the activated row to mitigate the usage-based disturbance.

Generally speaking, the techniques for logging a memory address associated with faulty usage-based disturbance data can be performed, at least partially, by the usage-based-disturbance data repair circuitry 122. More specifically, these techniques can be implemented using at least one detection circuit 124 and at least one address logging circuit 126. The address logging can be performed at a local-bank level 128 or at a multi-bank level 130, as further described below.

The detection circuit 124 detects an occurrence (or absence) of a fault associated with data that is referenced by the usage-based disturbance circuitry 120 to mitigate usage-based disturbance. This data is referred to as usage-based disturbance data. Generally speaking, the memory device 108 can perform a variety of error detection tests to determine whether or not the usage-based disturbance data (or memory cells that store the usage-based disturbance data) is faulty. Example error detection tests include a parity bit check, an error-correcting-code check, a checksum check, a cyclic redundancy check, another type of error detection procedure, or some combination thereof. In some implementations, the detection circuit 124 performs the error detection test and therefore directly detects the fault. In other implementations, the usage-based disturbance circuitry 120 performs the error detection test as part of the array counter update procedure. In this case, the detection circuit 124 stores information about any faults detected by the usage-based disturbance circuitry 120. The detection circuit 124 communicates the occurrence of the detected fault to the address logging circuit 126.

At the multi-bank level 130, the address logging circuit 126 logs (or captures) an address associated with the faulty usage-based disturbance data based on the detection circuit 124 indicating the occurrence of the detected fault. The address logging circuit 126 can further provide the logged address to other components of the memory device 108 so that the occurrence of the fault and the logged address can be communicated to the host device 104.

In example implementations, the detection circuit 124 is implemented at the local-bank level 128. This means that each detection circuit 124 detects the occurrence of faults within a corresponding bank of the memory device 108. The address logging circuit 126, in contrast to the detection circuit 124, is implemented at the multi-bank level 130. This means that one instance of the address logging circuit 126 can service two or more banks of the memory device 108.

At the multi-bank level 130, the address logging circuit 126 can readily pass information about the detected fault in a manner that enables the host device 104 to initiate the repair procedure. The local-bank level 128 implementation of the detection circuit 124 and the multi-bank level 130 implementation of the address logging circuit 126 are further described with respect to FIG. 5.

The usage-based-disturbance data repair circuitry 122 enables information about the occurrence of the fault and the address associated with the fault to be communicated to or accessed by the host device 104 (e.g., the memory controller 114). With this information, the host device 104 can initiate a repair procedure to fix the faulty data within the memory device 108. One type of repair procedure is a hard post-package repair (hPPR) procedure. For the hard post-package repair procedure, the memory controller 114 can request that the memory device 108 permanently repair a whole combination row, including the faulty data used for usage-based disturbance mitigation. With this repair procedure, however, the viability of existing data stored in the memory row is uncertain. Further, the permanent, nonvolatile nature of the hard post-package repair can entail blowing a fuse. The procedure is relatively lengthy and can often be performed only during power up and initialization, or with a full memory reset, instead of in real-time while the memory device 108 is functional and performing memory operations for the host device 104.

In contrast with the hard post-package repair, a soft post-package repair (sPPR) is a temporary repair procedure that is significantly faster. Further, although a soft post-package repair procedure produces a volatile repair, the soft post-package repair procedure can be performed in real-time responsive to detection of a failure. If a memory row is being repaired, the computing system may be responsible, however, for handling the data transfer (e.g., a full page of data) from the memory row corresponding to the faulty activation count to a spare counter and memory row combination. This data transfer can consume an appreciable amount of time while occupying the data bus. Other components of the memory device 108 are further described with respect to FIG. 2.

Figure 2:
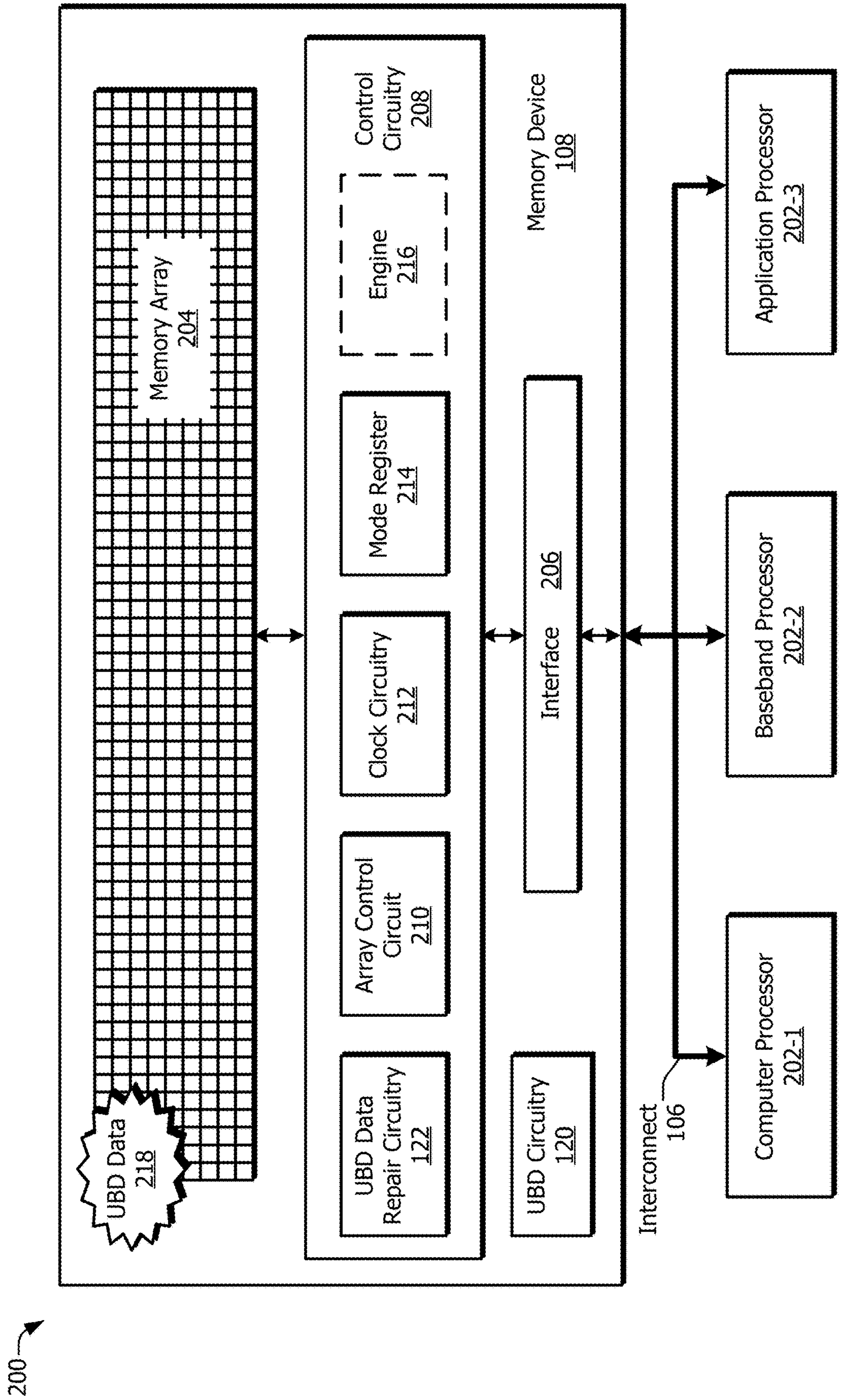
FIG. 2 illustrates an example computing system that can implement aspects of logging a memory address associated with faulty usage-based disturbance data.

FIG. 2 illustrates an example computing system 200 that can implement aspects of logging a memory address associated with faulty usage-based disturbance data. In some implementations, the computing system 200 includes at least one memory device 108, at least one interconnect 106, and at least one processor 202. The memory device 108 can include, or be associated with, at least one memory array 204, at least one interface 206, and control circuitry 208 (or periphery circuitry) operatively coupled to the memory array 204. The memory array 204 can include an array of memory cells, including but not limited to memory cells of DRAM, SDRAM, three-dimensional (3D) stacked DRAM, DDR memory, LPDDR SDRAM, and so forth. The memory array 204 and the control circuitry 208 may be components on a single semiconductor die or on separate semiconductor dies. The memory array 204 or the control circuitry 208 may also be distributed across multiple dies. This control circuitry 208 may manage traffic on a bus that is separate from the interconnect 106.

The control circuitry 208 can include various components that the memory device 108 can use to perform various operations. These operations can include communicating with other devices, managing memory performance, performing refresh operations (e.g., self-refresh operations or auto-refresh operations), and performing memory read or write operations. In the depicted configuration, the control circuitry 208 includes the usage-based disturbance data repair circuitry 122, at least one array control circuit 210, at least one instance of clock circuitry 212, and at least one mode register 214. The control circuitry 208 can also optionally include at least one engine 216.

The array control circuit 210 can include circuitry that provides command decoding, address decoding, input/output functions, amplification circuitry, power supply management, power control modes, and other functions. The clock circuitry 212 can synchronize various memory components with one or more external clock signals provided over the interconnect 106, including a command-and-address clock or a data clock. The clock circuitry 212 can also use an internal clock signal to synchronize memory components and may provide timer functionality.

In general, the control circuitry 208 stores the addresses that are logged by the usage-based disturbance data repair circuitry 122 in a manner that can be accessed by the memory controller 114. With this information, the memory controller 114 can initiate an appropriate repair procedure. In an example implementation, the mode register 214 facilitates control by and/or communication with the memory controller 114 (or one of the processors 202). Using the mode register 214, the memory device 108 can communicate information to the memory controller 114. Such communications can cause entry into or exit from a repair mode or a command that provides a memory row address to target for a repair procedure. To facilitate this communication, the mode register 214 may include one or more registers having at least one bit relating to usage-based disturbance repair functionality.

When implemented and enabled, the engine 216 can access each row of the memory array 204 in a controlled manner. The manner in which the engine 216 accesses the rows of the memory array 204 can be in accordance with an automatic mode or a manual mode. Generally, given sufficient time, the engine 216 accesses all rows of the memory array 204. In some implementations, the engine 216 accesses the rows of the memory array 204 in a periodic or cyclic manner. An order in which the engine 216 access the rows can be a predetermined order, a rule-based order, or a randomized order. In some implementations, the engine 216 is implemented as a test engine, which can detect and/or correct errors within at least a subset of the data that is stored within the rows. Example engines include an error-check and scrub engine (ECS engine), an add-based engine, or a refresh engine.

The memory device 108 also includes the usage-based disturbance circuitry 120. In some aspects, the usage-based disturbance circuitry 120 can be considered part of the control circuitry 208. For example, the usage-based disturbance circuitry 120 can represent another part of the control circuitry 208. The usage-based disturbance circuitry 120 can be coupled to a set of memory cells within the memory array 204 that store usage-based disturbance data 218 (UBD data 218). The usage-based disturbance data 218 can include information such as an activation count, which represents a quantity of times one or more rows within the memory array 204 have been activated (or accessed) by the memory device 108. In example implementations, each row of the memory array 204 includes a subset of memory cells that stores the usage-based disturbance data 218 associated with that row, as further described with respect to FIG. 3.

The interface 206 can couple the control circuitry 208 or the memory array 204 directly or indirectly to the interconnect 106. In some implementations, the usage-based disturbance circuitry 120, the usage-based disturbance data repair circuitry 122, the array control circuit 210, the clock circuitry 212, the mode register 214, and the engine 216 can be part of a single component (e.g., the control circuitry 208). In other implementations, one or more of the usage-based disturbance circuitry 120, the usage-based disturbance data repair circuitry 122, the array control circuit 210, the clock circuitry 212, the mode register 214, or the engine 216 may be implemented as separate components, which can be provided on a single semiconductor die or disposed across multiple semiconductor dies. These components may individually or jointly couple to the interconnect 106 via the interface 206.

The interconnect 106 may use one or more of a variety of interconnects that communicatively couple together various components and enable commands, addresses, or other information and data to be transferred between two or more components (e.g., between the memory device 108 and the processor 202). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a command-and-address bus and a data bus.

In some aspects, the memory device 108 may be a "separate" component relative to the host device 104 (of FIG. 1) or any of the processors 202. The separate components can include a printed circuit board, memory card, memory stick, and memory module (e.g., a single in-line memory module (SIMM) or dual in-line memory module (DIMM)). Thus, separate physical components may be located together within the same housing of an electronic device or may be distributed over a server rack, a data center, and so forth. Alternatively, the memory device 108 may be integrated with other physical components, including the host device 104 or the processor 202, by being combined on a printed circuit board or in a single package or a system-on-chip.

As shown in FIG. 2, the processors 202 may include a computer processor 202-1, a baseband processor 202-2, and an application processor 202-3, coupled to the memory device 108 through the interconnect 106. The processors 202 may include or form a part of a central processing unit, graphics processing unit, system-on-chip, application-specific integrated circuit, or field-programmable gate array. In some cases, a single processor can comprise multiple processing resources, each dedicated to different functions (e.g., modem management, applications, graphics, central processing). In some implementations, the baseband processor 202-2 may include or be coupled to a modem (not illustrated in FIG. 2) and referred to as a modem processor. The modem or the baseband processor 202-2 may be coupled wirelessly to a network via, for example, cellular, Wi-Fi®, Bluetooth®, near field, or another technology or protocol for wireless communication.

In some implementations, the processors 202 may be connected directly to the memory device 108 (e.g., via the interconnect 106). In other implementations, one or more of the processors 202 may be indirectly connected to the memory device 108 (e.g., over a network connection or through one or more other devices). The memory array 204 is further described with respect to FIG. 3.

Figure 3:
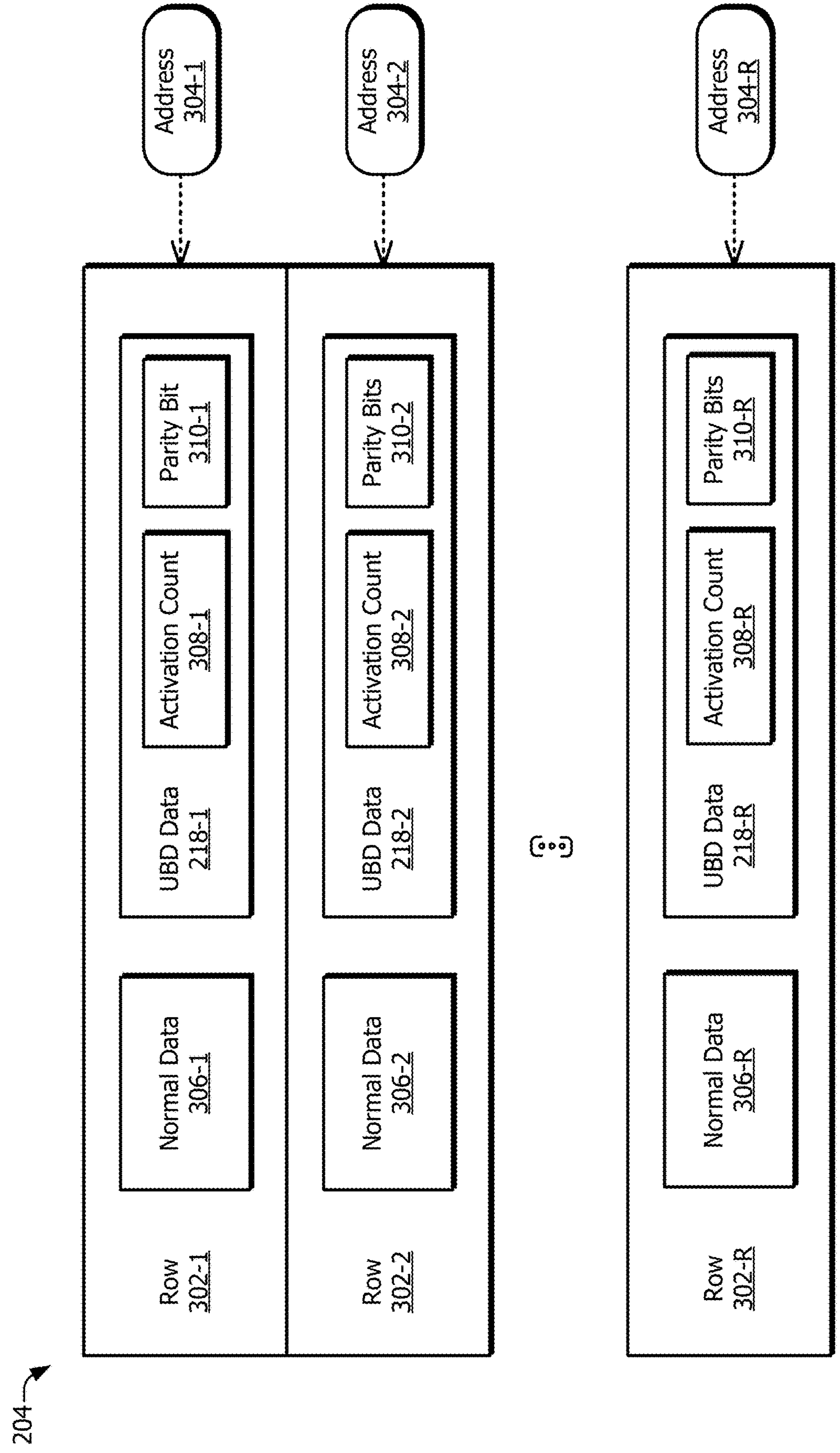
FIG. 3 illustrates example data stored within rows of a memory array.

FIG. 3 illustrates example data stored within rows of the memory array 204. The memory array 204 includes multiple rows 302 of memory cells. For example, the memory array 204 depicted in FIG. 3 includes rows 302-1, 302-2 . . . 302-R, where R represents a positive integer. Each row 302 is associated with an address 304 (e.g., a row address, a memory row address, or a memory address). For example, the first row 302-1 has a first address 304-1, the second row 302-2 has a second address 304-2, and an $R^{th}$ row 302-R has an $R^{th}$ address 304-R.

Each of the rows 302 can store normal data 306 within a first subset of the memory cells associated with that row 302. The normal data 306 represents data that is read from or written to the memory device 108 during normal memory operations (e.g., during normal read or write operations). The normal data 306, for example, can include data that is transmitted by the memory controller 114 and is written to one or more rows 302 of the memory array 204.

In addition to the normal data 306, each of the rows 302 can store usage-based disturbance data 218 within a second subset of the memory cells associated with that row 302. The usage-based disturbance data 218 includes information that enables the usage-based disturbance circuitry 120 to mitigate usage-based disturbance. In an example implementation, the usage-based disturbance data 218 includes an activation count 308.

In this example, the first row 302-1 stores first normal data 306-1 within a first subset of memory cells of the first row 302-1 and stores first usage-based disturbance data 218-1 within a second subset of memory cells of the first row 302-1. The first usage-based disturbance data 218-1 includes a first activation count 308-1, which represents a quantity of times the first row 302-1 has been activated since a last refresh. As another example, the second row 302-2 stores second normal data 306-2 within a first subset of memory cells within the second row 302-2 and stores second usage-based disturbance data 218-2 within a second subset of memory cells within the second row 302-2. The second usage-based disturbance data 218-2 includes a second activation count 308-2, which represents a quantity of times the second row 302-2 has been activated since a last refresh. Additionally, the $R^{th}$ row 302-R stores $R^{th}$ normal data 306-R within a first subset of memory cells within the $R^{th}$ row 302-R and stores $R^{th}$ usage-based disturbance data 218-R within a second subset of memory cells within the $R^{th}$ row 302-R. The $R^{th}$ usage-based disturbance data 218-R includes an $R^{th}$ activation count 308-R, which represents a quantity of times the $R^{th}$ row 302-R has been activated since a last refresh.

The usage-based disturbance data 218 also includes information or is formatted (e.g., coded) in such a way as to support error detection. In this example, the usage-based disturbance data 218 includes a parity bit 310 to enable detection of a faulty activation count 308 using a parity check. For instance, the usage-based disturbance data 218-1, 218-2, and 218-R respectively includes parity bits 310-1, 310-2, and 310-R. Other implementations are also possible in which the usage-based disturbance data 218 is coded in a manner that supports any of the error detection tests described above, such as the error-correcting-code check. Although the techniques for logging a memory address associated with faulty usage-based disturbance data 218 are described with respect to parity-bit errors associated with the activation count 308, these techniques can generally be applied for logging addresses for any type of usage-based disturbance data 218 and any type of error detection associated with this data.

Example Techniques and Hardware

Figure 4:
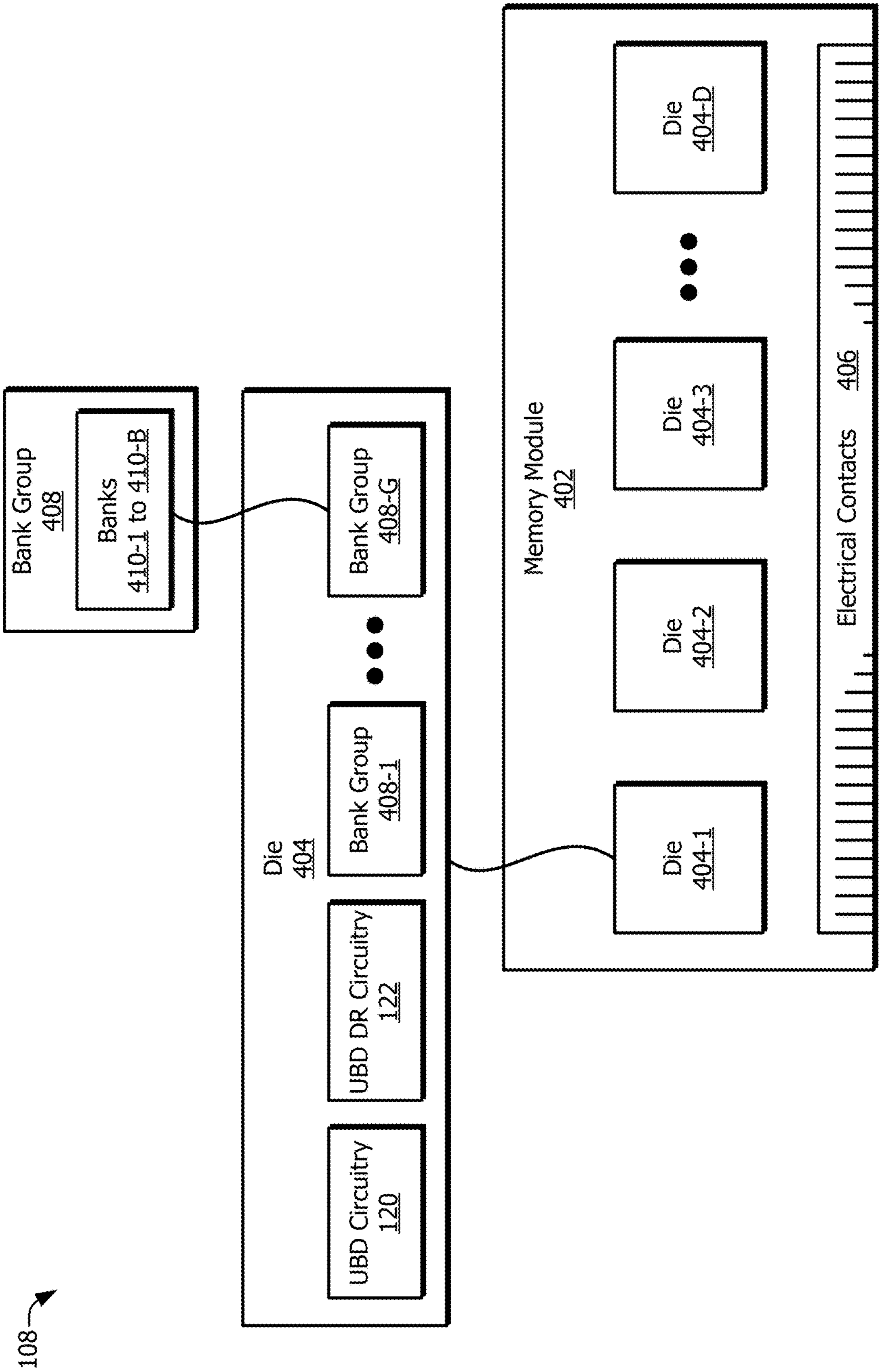
FIG. 4 illustrates an example memory device in which aspects of logging a memory address associated with faulty usage-based disturbance data may be implemented.

FIG. 4 illustrates an example memory device 108 in which aspects of logging a memory address associated with faulty usage-based disturbance data can be implemented. The memory device 108 includes a memory module 402, which can include multiple dies 404. As illustrated, the memory module 402 includes a first die 404-1, a second die 404-2, a third die 404-3, and a $D^{th}$ die 404-D, with D representing a positive integer. The memory module 402 can be a SIMM or a DIMM. As another example, the memory module 402 can interface with other components via a bus interconnect (e.g., a Peripheral Component Interconnect Express (PCIe®) bus). The memory device 108 illustrated in FIGS. 1 and 2 can correspond, for example, to multiple dies (or dice) 404-1 through 404-D, or a memory module 402 with two or more dies 404. As shown, the memory module 402 can include one or more electrical contacts 406 (e.g., pins) to interface the memory module 402 to other components.

The memory module 402 can be implemented in various manners. For example, the memory module 402 may include a printed circuit board, and the multiple dies 404-1 through 404-D may be mounted or otherwise attached to the printed circuit board. The dies 404 (e.g., memory dies) may be arranged in a line or along two or more dimensions (e.g., forming a grid or array). The dies 404 may have a similar size or may have different sizes. Each die 404 may be similar to another die 404 or different in size, shape, data capacity, or control circuitries. The dies 404 may also be positioned on a single side or on multiple sides of the memory module 402.

One or more of the dies 404-1 to 404-D include the usage-based disturbance circuitry 120, the usage-based-disturbance data repair circuitry 122 (UBD DR circuitry 122), and bank groups 408-1 to 408-G, with G representing a positive integer. Each bank group 408 includes at least two banks 410, such as banks 410-1 to 410-B, with B representing a positive integer. In some implementations, the die 404 includes multiple instances of the usage-based disturbance circuitry 120, which mitigate usage-based disturbance across at least one of the banks 410. For example, multiple instances of the usage-based disturbance circuitry 120 can respectively mitigate usage-based disturbance across the bank groups 408-1 to 408-G. In this example, one instance of usage-based disturbance circuitry 120 mitigates usage-based disturbance across multiple banks 410-1 to 410-B of a bank group 408. In another example, multiple instances of the usage-based disturbance circuitry 120 can respectively mitigate usage-based disturbance for respective banks 410. In this case, each usage-based disturbance circuitry 120 mitigates usage-based disturbance for a single bank 410 within one of the bank groups 408-1 to 408-G. In yet another example, each usage-based disturbance circuitry 120 mitigates usage-based disturbance for a subset of the banks 410 associated with one of the bank groups 408-1 to 408-G, where the subset of the banks 410 includes at least two banks 410. The relationship between the banks 410-1 to 410-B and components of the usage-based disturbance data repair circuitry 122 are further described with respect to FIG. 5.

Figure 5:
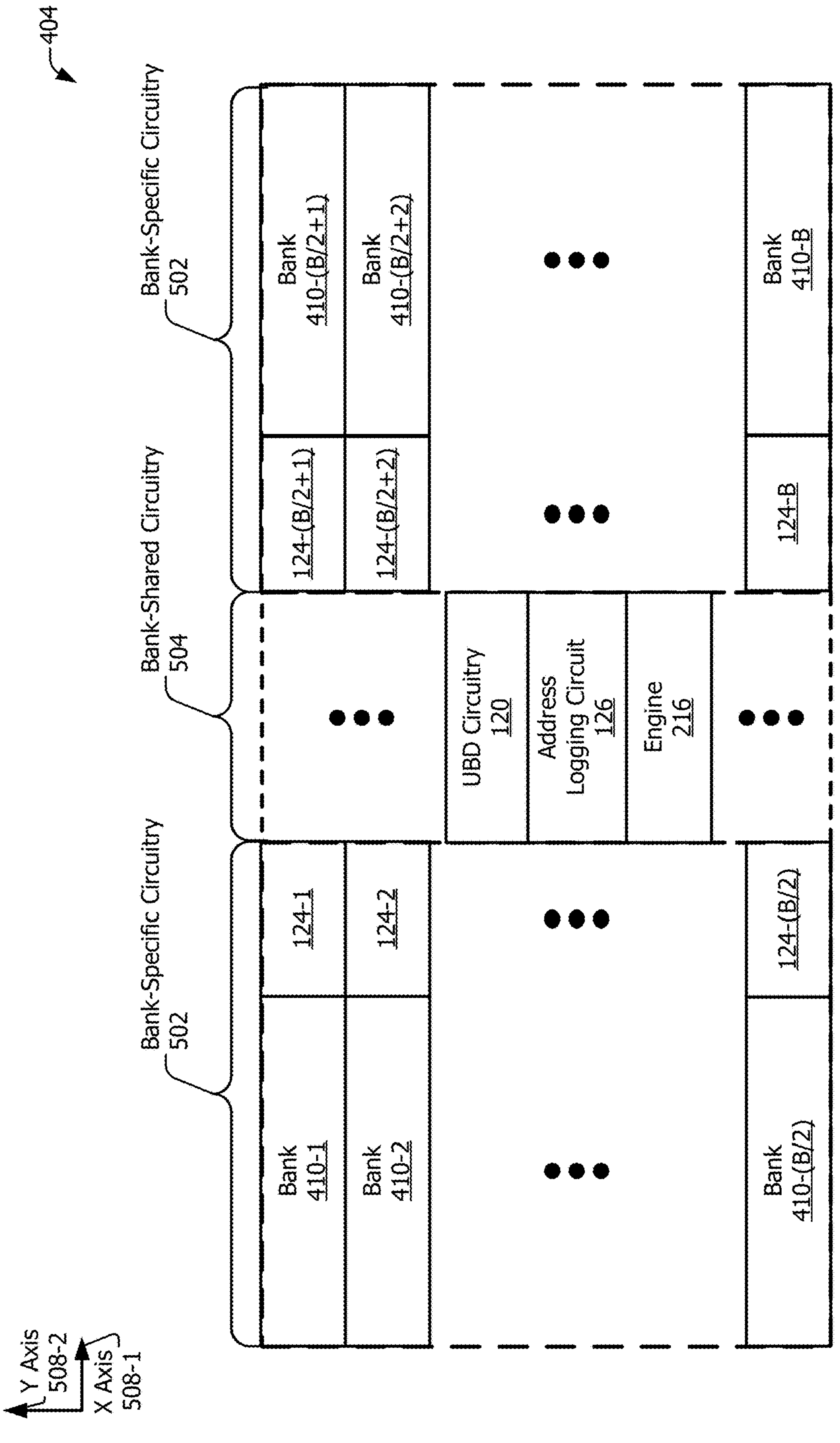
FIG. 5 illustrates an example arrangement of usage-based disturbance data repair circuitry on a die.

FIG. 5 illustrates an example arrangement of multiple detection circuits 124 and the address logging circuit 126 on a die 404. The die 404 includes bank-specific circuitry 502 and bank-shared circuitry 504. Bank-specific circuitry 502 includes components that are associated with a particular bank 410. For example, the bank-specific circuitry 502 includes the banks 410-1, 410-2 . . . 410-(B/2), 410-(B/2+1), 410-(B/2+2) . . . 410-B and the detection circuits 124-1, 124-2 . . . 124-(B/2), 124-(B/2+1), 124-(B/2+2) . . . 124-B. The detection circuits 124-1 to 124-B are respectively coupled to the banks 410-1 to 410-B. In some cases, subsets of the banks 410-1 to 410-B are associated with different bank groups 408. In an example implementation, the die 404 includes 32 banks 410 (e.g., B equals 32). The 32 banks 410 form eight bank groups 408 (e.g., G equals 8), with each bank group 408 including four of the banks 410. In other cases, the banks 410-1 to 410-B are associated with a single bank group 408.

Each detection circuit 124 can detect occurrence of a fault (or an error) associated with the usage-based disturbance data 218 stored within the corresponding bank 410. For example, the first detection circuit 124-1 can monitor for faults associated with the usage-based disturbance data 218 stored within the rows 302 of the first bank 410-1. Likewise, the second detection circuit 124-2 can monitor for faults associated with the usage-based disturbance data 218 stored within the rows 302 of the second bank 410-2.

The bank-shared circuitry 504 includes components that are associated with multiple banks 410. These components perform operations associated with multiple banks 410. Example components of the bank-shared circuitry 504 include the address logging circuit 126 and the engine 216 (if implemented). In this example, the usage-based disturbance circuitry 120 is also shown as part of the bank-shared circuitry 504. Alternatively, multiple instances of the usage-based disturbance circuitry 120 can be implemented as part of the bank-specific circuitry 502. In an example implementation, the address logging circuit 126 is positioned proximate to the engine 216.

On the die 404, the bank-specific circuitry 502 is positioned on two opposite sides of the bank-shared circuitry 504. Explained another way, the bank-shared circuitry 504 can be centrally positioned on the die 404. As such, the address logging circuit 126 can be positioned closer to a center of the die 404 compared to the edges of the die 404. Positioning the bank-shared circuitry 504 in the center enables routing between the bank-shared circuitry 504 and the bank-specific circuitry 502 to be simplified.

Consider a first axis 508-1 (e.g., X axis 508-1) and a second axis 508-2 (e.g., Y axis 508-2), which is perpendicular to the first axis 508-1. In FIG. 5, the first axis 508-1 is depicted as a "horizontal" axis, and the second axis 508-2 is depicted as a "vertical" axis. Components of the bank-shared circuitry 504 are distributed across the second axis 508-2. A first set of the banks (e.g., banks 410-1 to 410-B/2) are arranged along the second axis 508-2 on a "left" side of the bank-shared circuitry 504, and a second set of the banks (e.g., banks 410-(B/2+1) to 410-B) are arranged along the second axis 508-2 on a "right" side of the bank-shared circuitry 504. The detection circuits 124-1 to 124-B are positioned between the corresponding banks 410-1 to 410-B and the bank-shared circuitry 504. By positioning the address logging circuit 126 in a central location between the detection circuits 124-1 to 124-B, it can be easier to route signals between the address logging circuit 126 and the detection circuits 124-1 to 124-B. Operations of the detection circuits 124 and the address logging circuit 126 are further described with respect to FIG. 6.

Figure 6:
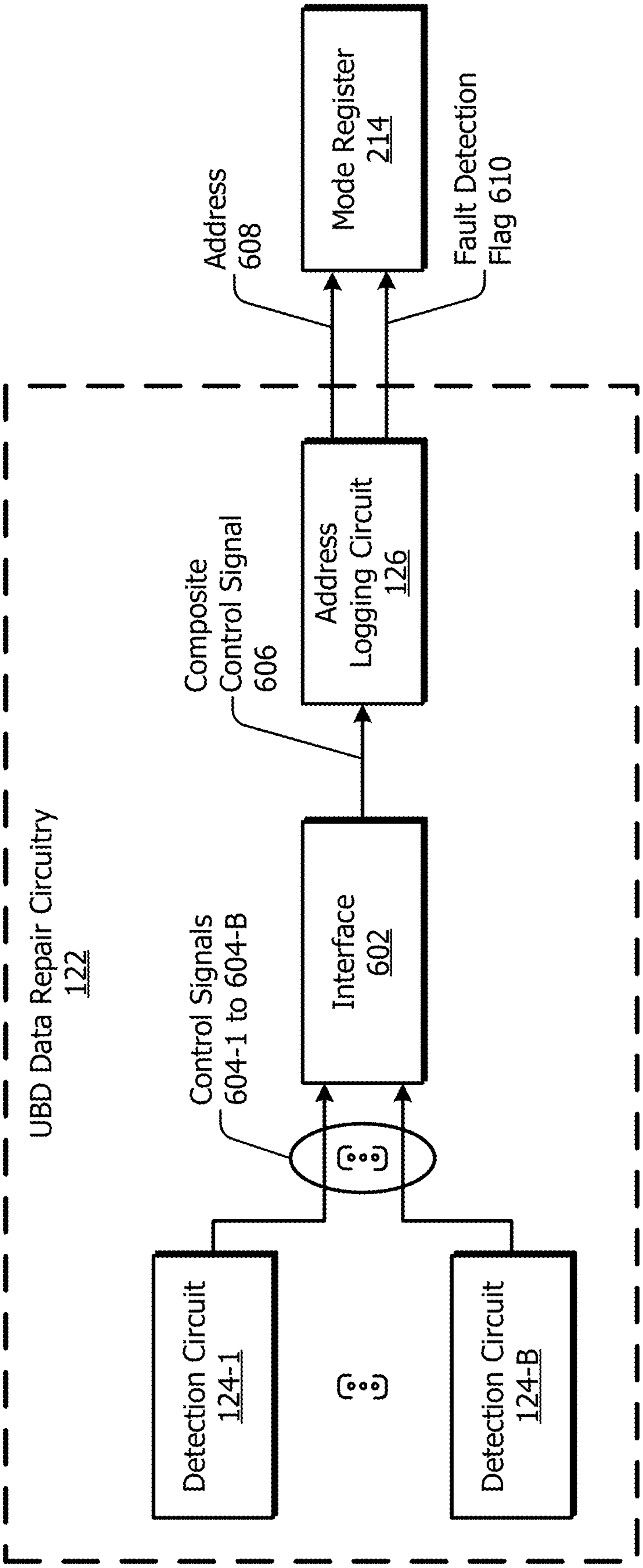
FIG. 6 illustrates an example of usage-based disturbance data repair circuitry coupled to a mode register for implementing aspects of logging a memory address associated with faulty usage-based disturbance data.

FIG. 6 illustrates an example of the usage-based disturbance data repair circuitry 122 coupled to the mode register 214. Although the mode register 214 is depicted as a single register in FIG. 6, other implementations of the mode register 214 can include more than one mode register.

In the depicted configuration, the usage-based disturbance data repair circuitry 122 includes the detection circuits 124-1 to 124-B and the address logging circuit 126, which is coupled to the mode register 214. Although not explicitly shown in FIG. 6, the detection circuits 124 and/or the address logging circuit 126 can be coupled to other components of the memory device, examples of which are described with respect to FIGS. 7 to 11.

The usage-based disturbance data repair circuitry 122 also includes an interface 602, which is coupled between the detection circuits 124-1 to 124-B and the address logging circuit 126. In general, the interface 602 provides a means for communication between a component at the local-bank level 128 (e.g., one of the detection circuits 124-1 to 124-B) and a component at the multi-bank level 130 (e.g., the address logging circuit 126). Various implementations of the interface 602 are further described with respect to FIGS. 7 to 11.

During operation, the detection circuits 124-1 to 124-B respectively generate control signals 604-1 to 604-B. The control signals 604-1 to 604-B at least indicate whether or not the respective detection circuits 124-1 to 124-B detect an occurrence of faulty usage-based disturbance data 218 within the corresponding banks 410-1 to 410-B.

The interface 602 generates a composite control signal 606 based on the control signals 604-1 to 604-B. The composite control signal 606 represents some combination of the local-bank address logging control signals 604-1 to 604-B. Using the composite control signal 606, the interface 602 can pass information provided by any one of the control signals 604-1 to 604-B to the address logging circuit 126.

The address logging circuit 126 can provide an address 608 and/or a fault detection flag 610 to the mode register 214 based on the composite control signal 606. The address 608 represents at least one of the addresses 304 for which the detection circuits 124-1 to 124-B determined is associated with the faulty usage-based disturbance data 218. The fault detection flag 610 indicates whether or not faulty usage-based disturbance data 218 has been detected. In one example implementation, the fault detection flag 610 represents a flag that is dedicated for detecting faults (or errors) associated with the usage-based disturbance data 218. In another example implementation, the fault detection flag 610 is implemented using another flag or signal that already exists within the memory device 108. For example, the fault detection flag 610 can be implemented using the reliability, availability, and serviceability (RAS) event signal or another alert signal. The fault detection flag 610 can also be referred to as an error flag, a parity flag, an activation count error flag, an activation count parity flag, and so forth.

The mode register 214 stores the address 608 and/or the fault detection flag 610. In some cases, the mode register 214 includes two registers that respectively store the address 608 and the fault detection flag 610. In another case, the mode register 214 includes one register that stores both the address 608 and the fault detection flag 610. The memory controller 114 can initiate one or more repair procedures based on the address 608 and/or the fault detection flag 610 stored by the mode register 214. In some implementations, the memory controller 114 can clear the fault detection flag 610 upon initiating a repair procedure. The usage-based disturbance data repair circuitry 122 can perform aspects of direct or indirect address logging, as further described with respect to FIGS. 7 and 8, respectively.

Figure 7:
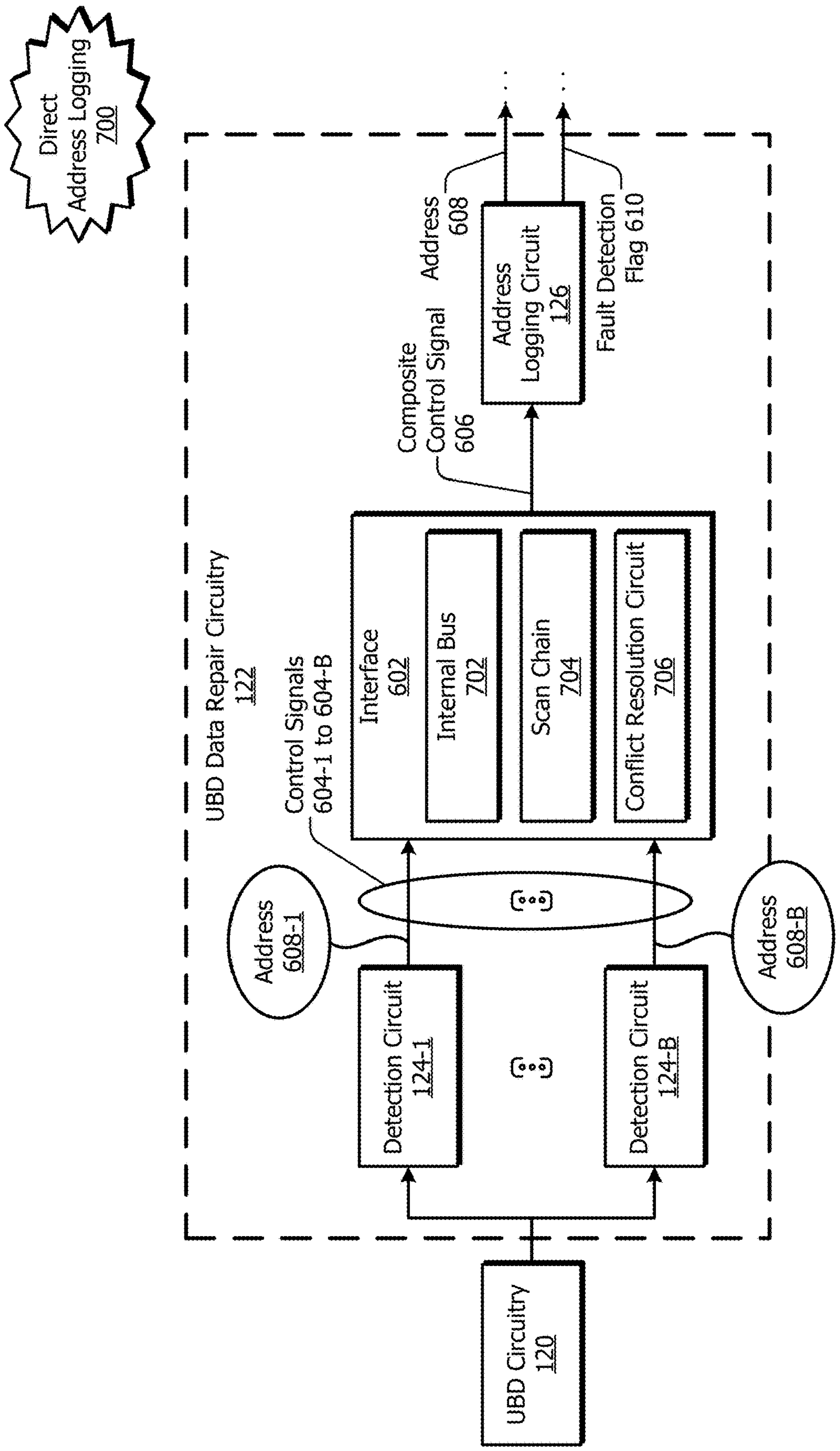
FIG. 7 illustrates an example implementation of usage-based disturbance data repair circuitry directly logging a memory address associated with faulty usage-based disturbance data.

FIG. 7 illustrates an example implementation of the usage-based disturbance data repair circuitry 122, which directly performs address logging at the local-bank level 128 as indicated at 700. In the depicted configuration, the control signals 604 indicate the address 608 associated with the faulty usage-based disturbance data 218. In this example, the usage-based disturbance data repair circuitry 122 can be coupled to the usage-based disturbance circuitry 120. This coupling enables the detection circuits 124-1 to 124-B to operate during the array counter update procedure, as further described below.

To communicate the address 608 from the local-bank level 128 to the multi-bank level 130, the interface 602 can be implemented using at least one internal bus 702 or at least one scan chain 704. The interface 602 can also include a conflict resolution circuit 706, which can resolve conflicts in which at least two detection circuits 124 detect an occurrence of faulty usage-based disturbance data 218 during a same time interval.

During operation, the usage-based disturbance circuitry 120 performs the array counter update procedure on an active row. As part of the array counter update procedure, the usage-based disturbance circuitry 120 or the detection circuits 124-1 to 124-B perform an error detection test to detect a fault associated with the usage-based disturbance data 218 (e.g., perform a parity check to detect a parity-bit failure associated with the activation count 308). If a fault is detected, the detection circuit 124 associated with the bank 410 in which the fault occurs determines the address 608 associated with the detected fault. For example, the detection circuit 124-1 determines that the address 608-1 is associated with the fault and/or the detection circuit 124-B determines that the address 608-B is associated with the fault. The detection circuits 124-1 to 124-B communicate the addresses 608-1 to 608-B to the address logging circuit 126 using the control signals 604-1 to 604-B.

While direct address logging 700 enables the address 608 associated with the faulty usage-based disturbance data 218 to be logged during the array counter update procedure and enables this address 608 to be stored in the mode register 214 with minimal delay, direct address logging 700 can increase a complexity and/or layout penalty associated with implementing the interface 602. This can increase the cost and/or size of the memory device 108. Alternatively, other implementations of the usage-based disturbance data repair circuitry 122 can perform indirect address logging, which is further described with respect to FIG. 8.

Figure 8:
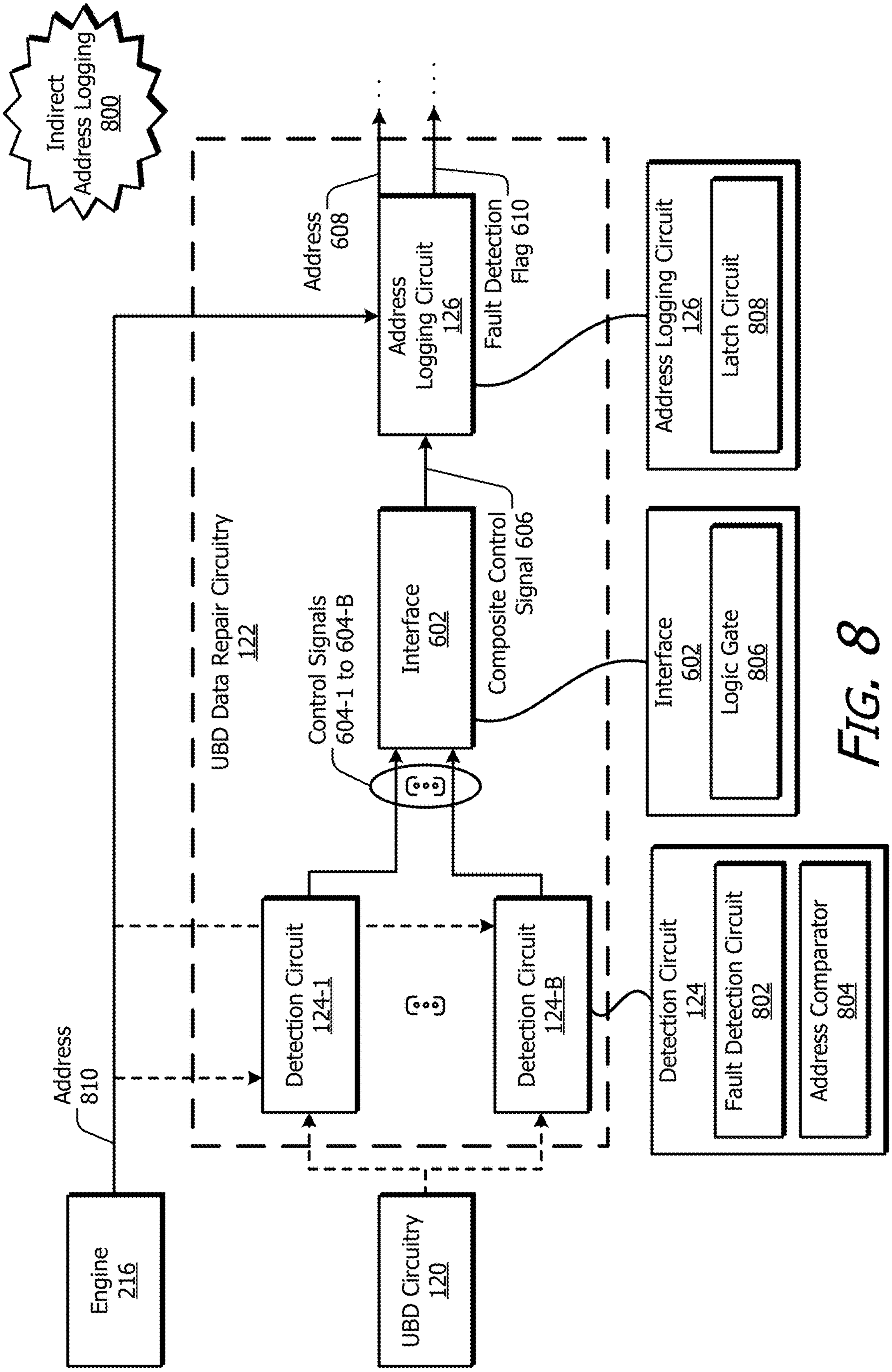
FIG. 8 illustrates an example implementation of usage-based disturbance data repair circuitry indirectly logging a memory address associated with faulty usage-based disturbance data.

FIG. 8 illustrates an example implementation of the usage-based disturbance data repair circuitry 122, which indirectly performs address logging at the multi-bank level 130, as indicated at 800, with the assistance of the engine 216. The engine 216 can be an existing engine 216 within the memory device 108 that performs other functions not associated with usage-based disturbance mitigation. In this case, the engine 216 accesses the rows 302 within the memory array 204 in a controlled manner or in a particular sequence. The information provided by the detection circuits 124-1 to 124-B via the control signals 604-1 to 604-B is based on or dependent upon the row 302 being accessed by the engine 216. More specifically, the detection circuits 124-1 to 124-B report faults using the control signals 604-1 to 604-B if the address 608 associated with the fault is related to the row 302 that is accessed by the engine 216. This dependency enables the address logging circuit 126 to determine the address 608 of the fault at the multi-bank level 130 based on the row 302 that is accessed by the engine 216 without having the address 608 routed from the local-bank level 128 to the multi-bank level 130. This controlled manner also avoids conflicts that can otherwise arise if multiple faults occur across multiple banks 410 during a same time interval. Generally speaking, indirect address logging 800 utilizes the engine 216 to provide a controlled way of logging addresses of faulty usage-based disturbance data 218 at the multi-bank level 130.

In the depicted configuration, the address logging circuit 126 is coupled to the engine 216. Depending on the implementation, the detection circuits 124-1 to 124-B can be coupled to the usage-based disturbance circuitry 120, the engine 216, or both. Example implementations of the detection circuit 124 can include at least one fault detection circuit 802 and/or at least one address comparator 804. The interface 602 can include at least one logic gate 806. The logic gate 806 can be implemented at the local-bank level 128 and generates the composite control signal 606 based on the control signals 604-1 to 604-B. The address logging circuit 126 can include at least one latch circuit 808, which can latch information provided by the engine 216 based on the composite control signal 606. Example implementations of the detection circuit 124, the interface 602, and the address logging circuit 126 are further described with respect to FIGS. 9 to 11.

During operation, the engine 216 performs operations on the rows 302 of the memory array 204. The engine 216 controls or determines the sequence in which the rows 302 are accessed. The address logging circuit 126 is coupled to the engine 216 and receives information about an address 810 that is accessed by the engine 216. The address logging circuit 126 can latch the address 810 at the multi-bank level 130 based on the composite control signal 606 indicating occurrence of a fault.

The detection circuits 124-1 to 124-B can determine the occurrence of the fault in different manners. In a first example implementation, the detection circuits 124-1 to 124-B perform the error detection test based on an occurrence of the engine 216 accessing the address 810. In this case, the error detection test is performed on rows 302 in a same order that the engine 216 accesses the rows 302. In a second example implementation, the error detection test is performed by the usage-based disturbance circuitry 120 or the detection circuits 124-1 to 124-B as part of or based on an occurrence of the array counter update procedure (or more generally a procedure that updates the usage-based disturbance data 218). The detection circuits 124-1 to 124-B store information associated with a detected fault and provide this information if the address 608 of the detected fault matches the address 810 that is accessed by the engine 216. The first example implementation of the detection circuits 124-1 to 124-B is further described with respect to FIG. 9.

Figure 9:
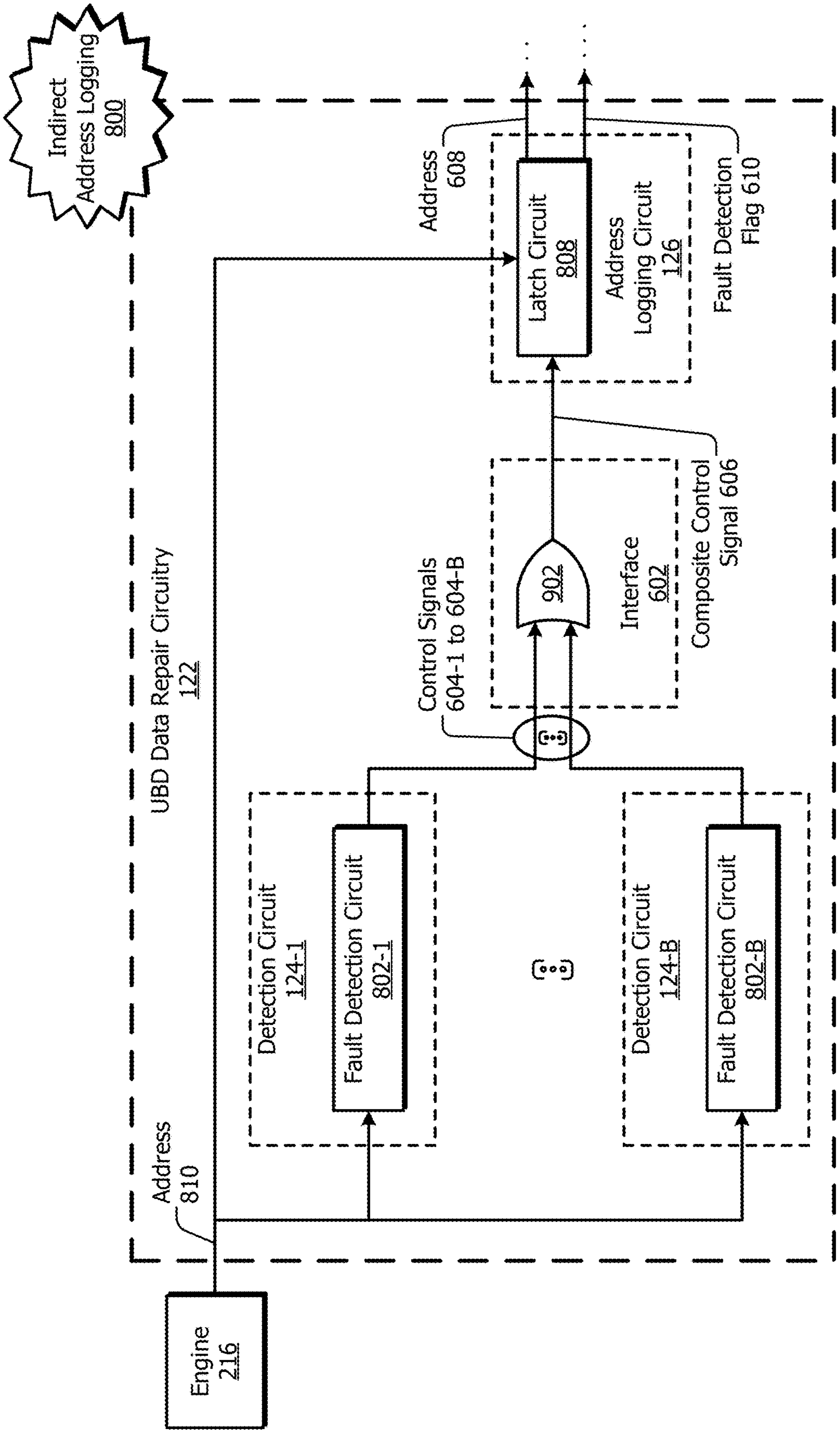
FIG. 9 illustrates first example implementations of detection circuits for indirectly logging a memory address associated with faulty usage-based disturbance data.

FIG. 9 illustrates first example implementations of the detection circuits 124-1 to 124-B for indirect address logging 800. In the depicted configuration, the interface 602 is implemented using a logic gate 806, which is depicted as an OR gate 902. Inputs of the OR gate 902 are coupled to outputs of the detection circuits 124-1 to 124-B. The address logging circuit 126 includes the latch circuit 808, which is coupled to the interface 602 and the engine 216.

The detection circuits 124-1 to 124-B respectively include fault detection circuits 802-1 to 802-B. The fault detection circuits 802-1 to 802-B are coupled to the engine 216 and perform the error detection test to detect faulty usage-based disturbance data 218. A manner in which the error detection tests are performed across the rows 302, however, is dependent upon a manner in which the engine 216 accesses the rows 302, as further described below.

During operation, the engine 216 performs an operation at a particular row 302. The address 810 that is accessed by the engine 216 is provided to the detection circuits 124-1 to 124-B. If the address 810 is within a bank 410 that corresponds with the detection circuit 124, that detection circuit 124 performs the error detection test on the usage-based disturbance data 218 associated with the address 810. For example, the detection circuit 124 performs a parity check to evaluate a parity bit 310 associated with the activation count 308. If the address 810 is not within the bank 410 that corresponds with the detection circuit 124, that detection circuit 124 does not perform an error detection test.

If the detection circuit 124 determines that the usage-based disturbance data 218 associated with the address 810 is faulty, the detection circuit 124 indicates detection of this fault via the corresponding control signal 604. The interface 602 generates the composite control signal 606, which also indicates the detection of the fault. Based on the composite control signal 606 indicating detection of the fault, the latch circuit 808 latches the address 810 that is provided by the engine 216. The address logging circuit 126 provides the address 810 as the address 608 to the mode register 214 (not shown). In some cases, the address logging circuit 126 provides the composite control signal 606 as the fault detection flag 610.

In this example, the execution of the error detection test occurs during or after a time interval in which the engine 216 accesses the address 810. In this manner, the fault detection and address logging are synchronized across the local-bank level 128 and the multi-bank level 130 based on the address 810 that is accessed by the engine 216. In other implementations, the fault detection can occur before the engine 216 accesses the address 810, as further described with respect to FIG. 10.

Figure 10:
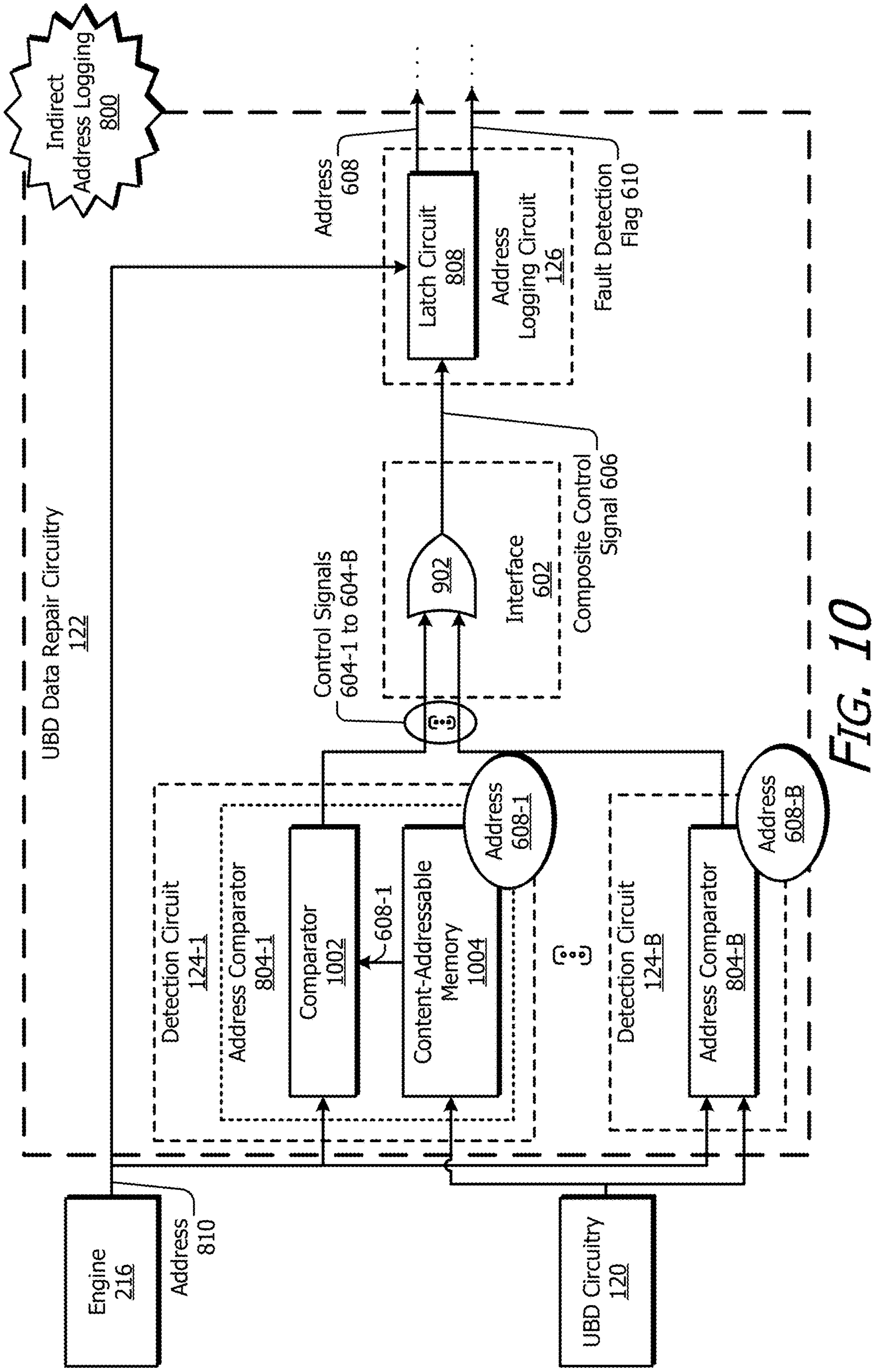
FIG. 10 illustrates second example implementations of detection circuits for indirectly logging a memory address associated with faulty usage-based disturbance data.

FIG. 10 illustrates second example implementations of the detection circuits 124-1 to 124-B for indirect address logging 800. In the depicted configuration, the detection circuits 124-1 to 124-B respectively include address comparators 804-1 to 804-B. The address comparators 804-1 to 804-B are coupled to the engine 216 and the usage-based disturbance circuitry 120. The address comparators 804-1 to 804-B can each include at least one comparator 1002 and at least one content-addressable memory (CAM) 1004. The comparator 1002 enables the results of the error detection tests to be reported in a manner that is dependent upon a manner in which the engine 216 accesses the rows 302, as further described below. The content-addressable memory 1004 stores information regarding the faulty usage-based disturbance data 218. In some implementations, the content-addressable memory 1004 can store one address 608 that is determined to have the faulty usage-based disturbance data 218. In other implementations, the content-addressable memory 1004 can store multiple addresses 608 that are determined to have the faulty usage-based disturbance data 218.

During operation, the usage-based disturbance circuitry 120 performs the array counter update procedure. As part of the array counter update procedure or based on the occurrence of the array counter update procedure, the usage-based disturbance circuitry 120 or the detection circuits 124-1 to 124-B perform the error detection test to detect faulty usage-based disturbance data 218. If faulty usage-based disturbance data 218 is detected, the address 608 of the faulty usage-based disturbance data 218 is stored within the content-addressable memory 1004 of the address comparator 804.

After the array counter update procedure is performed, the engine 216 accesses the address 810. The comparators 1002 of the address comparators 804-1 to 804-B compare the address 810 to the addresses 608-1 to 608-B stored in the content-addressable memory 1004. Consider an example in which the address 810 is the address 608-1 stored by the address comparator 804-1. In this case, the comparator 1002 of the detection circuit 124-1 determines that the address

810 matches the address 608-1, and generates the control signal 604-1 in a manner that indicates detection of faulty usage-based disturbance data 218. The interface 602 generates the composite control signal 606, which also indicates the detection of the fault. Based on the composite control signal 606 indicating detection of the fault, the latch circuit 808 latches the address 810 that is provided by the engine 216. The address logging circuit 126 provides the address 810 as the address 608 to the mode register 214 (not shown). In some cases, the address logging circuit 126 provides the composite control signal 606 as the fault detection flag 610.

In this example, the execution of the error detection test occurs before a time interval in which the engine 216 accesses the address 810. Although the fault detection and address logging can occur at different time intervals, reporting of the fault detection and address logging are synchronized across the local-bank level 128 and the multi-bank level 130 based on the address 810 that is accessed by the engine 216. In still other implementations, the detection circuits 124-1 to 124-B can include both the fault detection circuits 802 and the address comparators 804, as further described with respect to FIG. 11.

Figure 11:
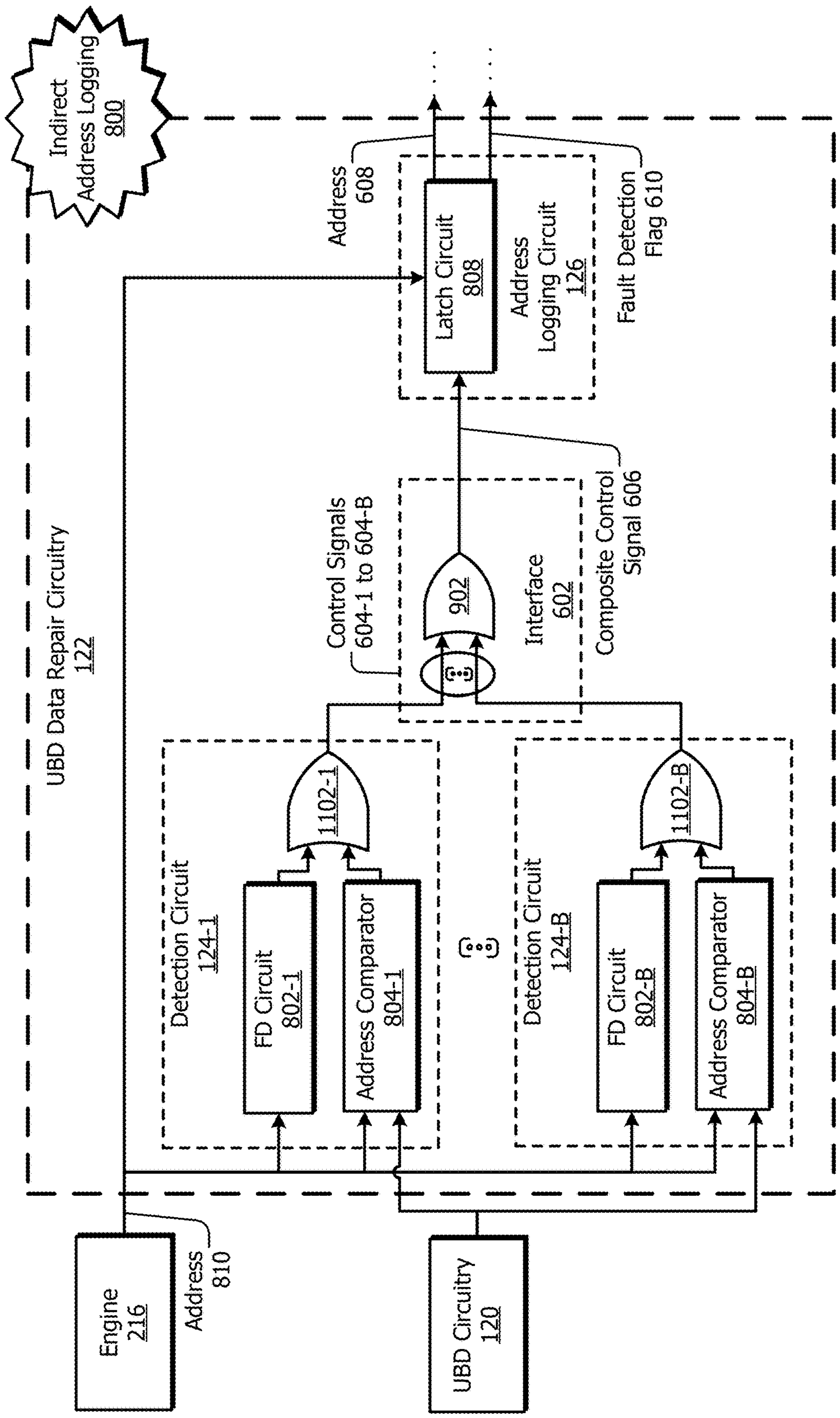
FIG. 11 illustrates third example implementations of detection circuits for indirectly logging a memory address associated with faulty usage-based disturbance data.

FIG. 11 illustrates third example implementations of the detection circuits 124-1 to 124-B. In the depicted configuration, the detection circuits 124-1 to 124-B respectively include the fault detection circuits 802-1 to 802-B, the address comparators 804-1 to 804-B, and optionally the OR gates 1102-1 to 1102-B. The operations of the fault detection circuits 802-1 to 802-B are similar to the operations described with respect to FIG. 9. The operations of the address comparators 804-1 to 804-B are similar to the operations described with respect to FIG. 10.

This implementation of the detection circuits 124-1 to 124-B provides additional opportunities for the error detection tests to be executed, and therefore enables the usage-based disturbance data repair circuitry 122 to more quickly detect faulty usage-based disturbance data 218. For example, the fault detection circuits 802-1 to 802-B enable faulty usage-based disturbance data 218 to be detected based on an occurrence of the engine 216 accessing a row while the address comparator 804-1 to 804-B enables faulty usage-based disturbance data 218 to be detected based on an occurrence of an array counter update procedure. As seen in FIGS. 8-11, indirect address logging 800 enables the memory device 108 to be implemented with a less complicated interface 602 and is associated with a smaller die-size penalty compared to direct address logging 700 shown in FIG. 7. Indirect address logging 800 also avoids conflict resolution by controlling the reporting of faults based on an order in which the engine 216 accesses the rows 302.

Example Method

Figure 12:
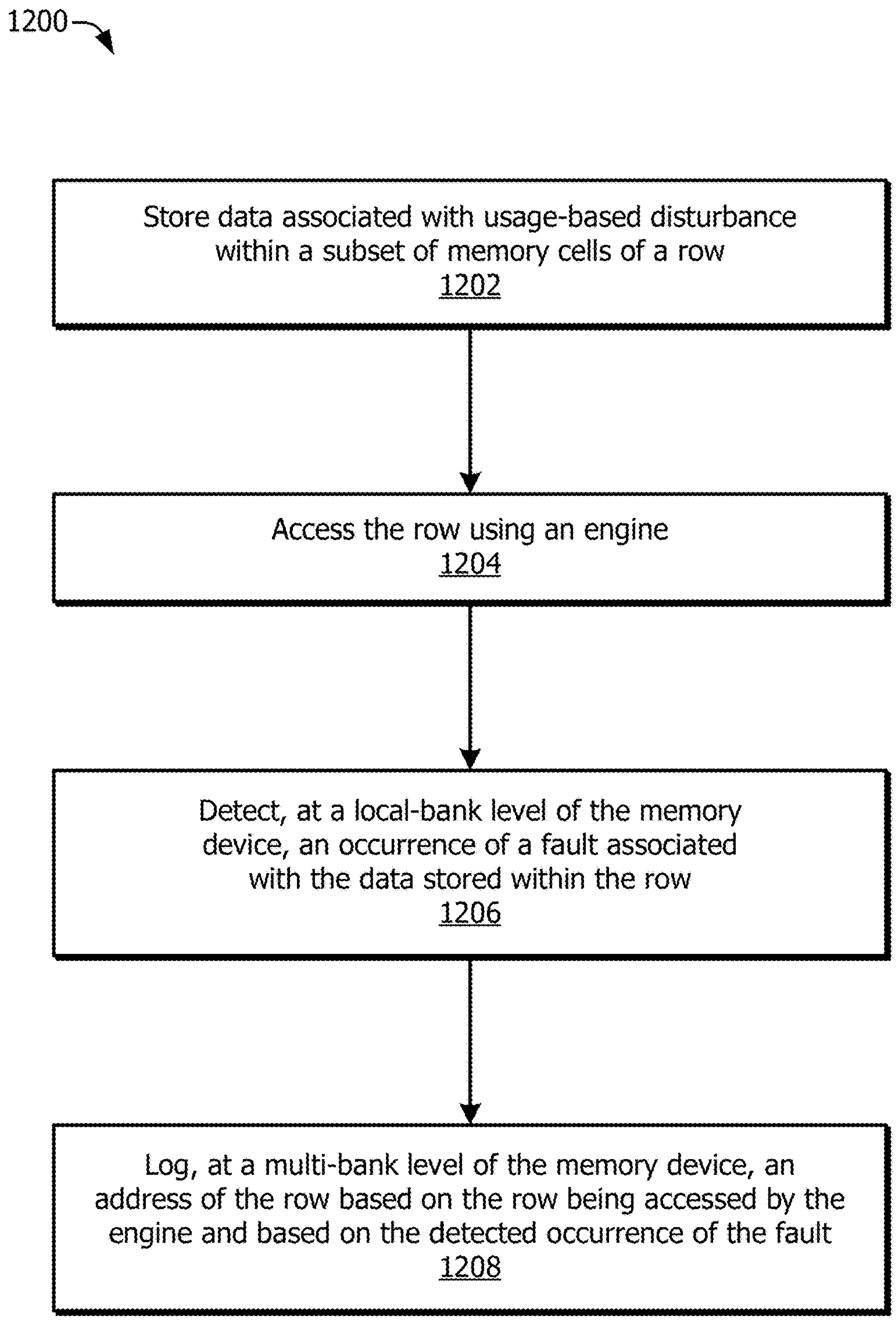
FIG. 12 illustrates an example method of a memory device performing aspects of logging a memory address associated with faulty usage-based disturbance data.

This section describes example methods for implementing aspects of logging a memory address associated with faulty usage-based disturbance data with reference to the flow diagram of FIG. 12. These descriptions may also refer to components, entities, and other aspects depicted in FIGS. 1 to 11 by way of example only. The described method is not necessarily limited to performance by one entity or multiple entities operating on one device.

FIG. 12 illustrates a method 1200, which includes operations 1202 through 1208. In aspects, operations of the method 1200 are implemented by a memory device 108 as described with reference to FIG. 1. At 1202, data associated with usage-based disturbance is stored within a subset of memory cells of a row. For example, the row 302 stores the usage-based disturbance data 218 within a subset of the memory cells. The usage-based disturbance data 218 can be accessed by the usage-based disturbance circuitry 120 and used to mitigate usage-based disturbance. In an example implementation, the usage-based disturbance data 218 represents an activation count 308. In some implementations, the host device 104 (e.g., the memory controller 114) does not have access to the usage-based disturbance data 218.

At 1204, the row is accessed using an engine. For example, the engine 216 accesses the row 302. The engine 216 can access to the row and perform an operation on the normal data 306 that is stored within another subset of the memory cells of the row 302. In an example implementation, the engine 216 is implemented as an error check and scrub engine, which can detect errors within the normal data 306. In some implementations, the engine 216 does not directly perform operations associated with usage-based disturbance mitigation or does not perform operations on the usage-based disturbance data 218.

In general, the engine 216 is capable of accessing all of the rows 302 within the memory array 204. This enables the techniques associated with indirect address logging 800 to report the occurrence of faults associated with the usage-based disturbance data 218 in a controlled manner that avoids conflicts across multiple banks 410.

At 1206, an occurrence of a fault associated with the data stored within the row is detected at a local-bank level of the memory device. For example, the usage-based-disturbance data repair circuitry 122 detects, at the local-bank level, the occurrence of the fault associated with the usage-based disturbance data 218 that is stored within the row 302. In some implementations, the usage-based-disturbance data repair circuitry 122 can directly detect the fault by executing an error detection test at the local-bank level. The error detection test can be performed based on an occurrence of a procedure performed by the usage-based disturbance circuitry 120 to update the usage-based disturbance data 218 and/or based on an occurrence of the engine 216 accessing the row 302. In other implementations, the usage-based disturbance circuitry 120 can directly detect the fault by executing the error detection test and provide an indication to the usage-based-disturbance data repair circuitry 122 if the fault is detected.

At 1208, an address of the row is logged, at a multi-bank level of the memory device, based on the row being accessed by the engine and based on the detected occurrence of the fault. For example, the usage-based-disturbance data repair circuitry 122 logs, at the multi-bank level 130 of the memory device 108, the address 608 of the row 302 based on the row 302 being accessed by the engine 216 and based on the detected occurrence of the fault, which is reported from (or indicated by) the local-bank level 128 to the multi-bank level 130. In particular, the usage-based-disturbance data repair circuitry 122 can latch the address 810 that is accessed by the engine 216 based on the local-bank level 128 indicating occurrence of a fault that is associated with the address 810. The usage-based-disturbance data repair circuitry 122 can store the latched address 608 and/or the fault detection flag 610 in one or more mode registers 214 that can be accessed by the host device 104. With this information, the host device 104 can initiate a repair procedure that addresses the detected fault associated with the usage-based disturbance data 218 stored within the row 302.

For the figure described above, the order in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of this method may be implemented in, for example, hardware (e.g., fixed-circuit circuitry or a processor in conjunction with a memory), firmware, software, or some combination thereof. The method may be realized using one or more of the apparatuses or components shown in FIGS. 1 to 11, the components of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Computer-readable media includes both non-transitory computer storage media and communication media including any medium that facilitates transfer of a computer program (e.g., an application) or data from one entity to another. Non-transitory computer storage media can be any available medium accessible by a computer, such as RAM, ROM, Flash, EEPROM, optical media, and magnetic media.

In the following, various examples for implementing aspects of logging a memory address associated with faulty usage-based disturbance data are described:

Example 1: An apparatus comprising:

a memory device comprising:

at least one bank comprising multiple rows of memory cells, each row of the multiple rows configured to store data associated with usage-based disturbance within a subset of the memory cells;

an engine configured to access the multiple rows of the at least one bank; and circuitry coupled to the engine and the at least one bank, the circuitry configured to:

detect an occurrence of a fault associated with the stored data within a row of the multiple rows; and log an address of the row based on the row being accessed by the engine and based on the detected occurrence of the fault.

Example 2: The apparatus of example 1 or any other example, wherein the circuitry comprises:

at least one first circuit coupled to the at least one bank and implemented at a local-bank level, the at least one first circuit configured to report the detected occurrence of the fault based on the row being accessed by the engine; and a second circuit coupled to the at least one first circuit and implemented at a multi-bank level, the second circuit configured to latch the address of the row that is accessed by the engine based on the report provided by the first circuit.

Example 3: The apparatus of example 2 or any other example, wherein:

the at least one bank comprises multiple banks;

the at least one first circuit comprises multiple first circuits respectively coupled to the multiple banks; and the circuitry comprises a logic gate coupled between the multiple first circuits and the second circuit.

Example 4: The apparatus of example 1 or any other example, wherein the circuitry is configured to detect the occurrence of the fault prior to the engine accessing the row.

Example 5: The apparatus of example 4 or any other example, wherein:

the memory device comprises other circuitry configured to perform a procedure that updates the data stored within the row; and the circuitry is configured to:

store the address of the row based on an error detection test detecting the fault associated with the data, the error detection test being executed based on an occurrence of the procedure; and report, from a local-bank level to a multi-bank level, the detection of the occurrence of the fault based on the stored address matching the address of the row that is accessed by the engine.

Example 6: The apparatus of example 1 or any other example, wherein the circuitry is configured to detect the occurrence of the fault during or after the engine accesses the row.

Example 7: The apparatus of example 6 or any other example, wherein the circuitry is configured to perform, based on the engine accessing the row, an error detection test to detect the occurrence of the fault.

Example 8: The apparatus of example 1 or any other example, wherein:

the memory device comprises at least one mode register; and the circuitry is configured to:

store the logged address within the at least one mode register; and set a flag within the at least one mode register to indicate the occurrence of the fault.

Example 9: The apparatus of example 8 or any other example, wherein:

the memory device is configured to be coupled to a memory controller; and the flag causes the memory controller to initiate a process to repair the row associated with the logged address.

Example 10: The apparatus of example 1 or any other example, wherein the data associated with usage-based disturbance comprises an activation count that represents a quantity of times a corresponding row has been accessed since a last refresh.

Example 11: The apparatus of example 1 or any other example, wherein:

the data associated with usage-based disturbance comprises a parity bit; and the circuitry is configured to detect the occurrence of the fault based on a parity check.

Example 12: The apparatus of example 1 or any other example, wherein:

each row of the multiple rows is configured to store other data associated with normal memory operations within a second subset of the memory cells; and the engine is configured to perform an operation on the other data.

Example 13: The apparatus of example 12 or any other example, wherein the engine comprises an error check and scrub engine configured to perform error detection on the other data.

Example 14: A method performed by a memory device, the method comprising:

storing data associated with usage-based disturbance within a subset of memory cells of a row;

accessing the row using an engine;

detecting, at a local-bank level of the memory device, an occurrence of a fault associated with the data stored within the row; and logging an address of the row at a multi-bank level of the memory device based on the row being accessed by the engine and based on the detected occurrence of the fault.

Example 15: The method of example 14 or any other example, further comprising:

reporting, from the local-bank level to the multi-bank level, the detected occurrence of the fault based on the row being accessed by the engine.

Example 16: The method of example 14 or any other example, further comprising:

performing an error detection test on the data stored within the row to detect the fault based on at least one of the following:

occurrence of a procedure that updates the data stored within the row; or the engine accessing the row.

Example 17: An apparatus comprising:

a memory device comprising:

at least one bank comprising multiple rows of memory cells, each row of the multiple rows configured to store data associated with usage-based disturbance within a subset of the memory cells;

an engine configured to access the multiple rows of the at least one bank; and circuitry comprising:

at least one first circuit coupled to the at least one bank and implemented at a local-bank level, the at least one first circuit configured to report detection of an occurrence of a fault associated with the data stored within a row of the multiple rows based on the engine accessing the row; and a second circuit coupled to the engine and the at least one first circuit, the second circuit implemented at a multi-bank level and configured to latch an address of the row that is accessed by the engine based on the reported detection provided by the at least one first circuit.

Example 18: The apparatus of example 17 or any other example, wherein the at least one first circuit is configured to:

execute an error detection test on the data of the row based on the engine accessing the row; and detect the occurrence of the fault based on the error detection test.

Example 19: The apparatus of example 17 or any other example, wherein:

the memory device comprises other circuitry configured to perform a procedure that updates the data stored within the row; and the at least one first circuit is configured to:

store the address of the row based on an error detection test detecting the fault associated with the data, the error detection test being executed based on the procedure; and report to the second circuit the detection of the occurrence of the fault based on the stored address matching the address of the row that is accessed by the engine.

Example 20: The apparatus of example 17 or any other example, wherein:

the memory device comprises other circuitry configured to perform a procedure that updates the data stored within the row; and the at least one first circuit is configured to detect the occurrence of the fault based on at least one of the following:

a first error detection test that is executed based on the other circuitry performing the procedure on the row; or a second error detection that is executed based on the engine accessing the row.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although aspects of logging a memory address associated with faulty usage-based disturbance data have been described in language specific to certain features and/or methods, the subject of the appended claims is not necessarily limited to the specific features or methods described. Rather, the specific features and methods are disclosed as a variety of example implementations of logging a memory address associated with faulty usage-based disturbance data.

What is claimed is:

1. An apparatus comprising:

a memory device comprising:

at least one bank comprising multiple rows of memory cells, each row of the multiple rows configured to store data associated with usage-based disturbance within a subset of the memory cells, the data associated with usage-based disturbance comprising an activation count that represents a quantity of times a corresponding row has been accessed since a last refresh;

an engine configured to access the multiple rows of the at least one bank; and circuitry coupled to the engine and the at least one bank, the circuitry configured to:

detect an occurrence of a fault associated with the stored data stored within a row of the multiple rows; and log an address of the row based on the row being accessed by the engine and based on the detected occurrence of the fault.

2. The apparatus of claim 1, wherein the circuitry comprises:

at least one first circuit coupled to the at least one bank and implemented at a local-bank level, the at least one first circuit configured to report the detected occurrence of the fault based on the row being accessed by the engine; and a second circuit coupled to the at least one first circuit and implemented at a multi-bank level, the second circuit configured to latch the address of the row that is accessed by the engine based on the report provided by the at least one first circuit.

3. The apparatus of claim 2, wherein:

the at least one bank comprises multiple banks;

the at least one first circuit comprises multiple first circuits respectively coupled to the multiple banks; and the circuitry comprises a logic gate coupled between the multiple first circuits and the second circuit.

4. The apparatus of claim 1, wherein the circuitry is configured to detect the occurrence of the fault prior to the engine accessing the row.

5. The apparatus of claim 4, wherein:

the memory device is configured to perform a procedure that updates the data stored within the row; and the circuitry is configured to:

store the address of the row based on an error detection test detecting the fault associated with the data, the error detection test being executed based on an occurrence of the procedure; and report, from a local-bank level to a multi-bank level, the detection of the occurrence of the fault based on the stored address matching the address of the row that is accessed by the engine.

6. The apparatus of claim 1, wherein the circuitry is configured to detect the occurrence of the fault during or after the engine accesses the row.

7. The apparatus of claim 6, wherein the circuitry is configured to perform, based on the engine accessing the row, an error detection test to detect the occurrence of the fault.

8. The apparatus of claim 1, wherein:

the memory device comprises at least one mode register; and the circuitry is configured to:

store the logged address within the at least one mode register; and set a flag within the at least one mode register to indicate the occurrence of the fault.

9. The apparatus of claim 8, wherein:

the memory device is configured to be coupled to a memory controller; and the flag causes the memory controller to initiate a process to repair the row associated with the logged address.

10. The apparatus of claim 1, wherein:

the data associated with usage-based disturbance comprises a parity bit; and the circuitry is configured to detect the occurrence of the fault based on a parity check.

11. The apparatus of claim 1, wherein:

each row of the multiple rows is configured to store other data associated with normal memory operations within a second subset of the memory cells; and the engine is configured to perform an operation on the other data.

12. The apparatus of claim 11, wherein the engine comprises an error check and scrub engine configured to perform error detection on the other data.

13. A method performed by a memory device, the method comprising:

storing data associated with usage-based disturbance within a subset of memory cells of a row, the data associated with usage-based disturbance comprising an activation count that represents a quantity of times the row has been accessed since a last refresh;

accessing the row using an engine;

detecting, at a local-bank level of the memory device, an occurrence of a fault associated with the data stored within the row; and logging an address of the row at a multi-bank level of the memory device based on the row being accessed by the engine and based on the detected occurrence of the fault.

14. The method of claim 13, further comprising:

reporting, from the local-bank level to the multi-bank level, the detected occurrence of the fault based on the row being accessed by the engine.

15. The method of claim 13, further comprising:

performing an error detection test on the data stored within the row to detect the fault based on at least one of the following:

occurrence of a procedure that updates the data stored within the row; or the engine accessing the row.

16. An apparatus comprising:

a memory device comprising:

at least one bank comprising multiple rows of memory cells, each row of the multiple rows configured to store data associated with usage-based disturbance within a subset of the memory cells, the data associated with usage-based disturbance comprising an activation count that represents a quantity of times a corresponding row has been accessed since a last refresh;

an engine configured to access the multiple rows of the at least one bank; and circuitry comprising:

at least one first circuit coupled to the at least one bank and implemented at a local-bank level, the at least one first circuit configured to report detection of an occurrence of a fault associated with the data stored within a row of the multiple rows based on the engine accessing the row; and a second circuit coupled to the engine and the at least one first circuit, the second circuit implemented at a multi-bank level and configured to latch an address of the row that is accessed by the engine based on the reported detection provided by the at least one first circuit.

17. The apparatus of claim 16, wherein the at least one first circuit is configured to:

execute an error detection test on the data of the row based on the engine accessing the row; and detect the occurrence of the fault based on the error detection test.

18. The apparatus of claim 16, wherein:

the memory device is configured to perform a procedure that updates the data stored within the row; and the at least one first circuit is configured to:

store the address of the row based on an error detection test detecting the fault associated with the data, the error detection test being executed based on the procedure; and report to the second circuit the detection of the occurrence of the fault based on the stored address matching the address of the row that is accessed by the engine.

19. The apparatus of claim 16, wherein:

the memory device comprises other circuitry configured to perform a procedure that updates the data stored within the row; and the at least one first circuit is configured to detect the occurrence of the fault based on at least one of the following:

a first error detection test that is executed based on the other circuitry performing the procedure on the row; or a second error detection that is executed based on the engine accessing the row.

20. The method of claim 14, further comprising:

storing the logged address within at least one mode register of the memory device;

setting a flag within the at least one mode register to indicate the detected occurrence of the fault; and causing a memory controller that is coupled to the memory device to initiate a process to repair the row associated with the logged address.

* * * * *